United States Patent
Zhou et al.

(10) Patent No.: US 10,381,364 B2
(45) Date of Patent: Aug. 13, 2019

(54) THREE-DIMENSIONAL MEMORY DEVICE INCLUDING VERTICALLY OFFSET DRAIN SELECT LEVEL LAYERS AND METHOD OF MAKING THEREOF

(71) Applicant: SANDISK TECHNOLOGIES LLC, Plano, TX (US)

(72) Inventors: Fei Zhou, Milpitas, CA (US); Rahul Sharangpani, Fremont, CA (US); Yanli Zhang, San Jose, CA (US); Raghuveer S. Makala, Campbell, CA (US); Senaka Krishna Kanakamedala, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 60 days.

(21) Appl. No.: 15/628,495

(22) Filed: Jun. 20, 2017

(65) Prior Publication Data
US 2018/0366482 A1   Dec. 20, 2018

(51) Int. Cl.
*H01L 27/11524* (2017.01)
*H01L 27/11556* (2017.01)
(Continued)

(52) U.S. Cl.
CPC .... *H01L 27/11556* (2013.01); *H01L 21/8221* (2013.01); *H01L 27/1157* (2013.01);
(Continued)

(58) Field of Classification Search
None
See application file for complete search history.

(56) References Cited

U.S. PATENT DOCUMENTS

| 5,915,167 A | 6/1999 | Leedy |
| 9,331,094 B2 | 1/2016 | Pachamuthu et al. |

(Continued)

FOREIGN PATENT DOCUMENTS

KR   20110121930 A   11/2011

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Cheung Lee
(74) *Attorney, Agent, or Firm* — The Marbury Law Group PLLC

(57) ABSTRACT

A three-dimensional memory device can be formed by first forming an alternating stack of insulating layers and stack level spacer material layers over a substrate. The stack level spacer material layers can be formed as, or are subsequently replaced with, stack level electrically conductive layers. A bottommost insulating spacer layer is formed with recesses that form grooves that are laterally spaced apart. Drain select level electrically conductive layers are formed over protruding portions and within the grooves of the bottommost insulating spacer layer by anisotropic deposition and isotropic etch back of a conductive material. Additional insulating spacer layers may be formed by anisotropic deposition of an insulating material. Additional drain select level electrically conductive layers can be formed by anisotropic deposition and isotropic etch back of additional conductive material. Memory stack structures can be formed through the drain select level electrically conductive layers and through the alternating stack.

8 Claims, 35 Drawing Sheets

(51) Int. Cl.

| | | |
|---|---|---|
| *H01L 27/11519* | (2017.01) | |
| *H01L 27/11582* | (2017.01) | |
| *H01L 27/1157* | (2017.01) | |
| *H01L 27/11565* | (2017.01) | |
| *H01L 21/822* | (2006.01) | |
| *H01L 27/11551* | (2017.01) | |

(52) U.S. Cl.
CPC .. *H01L 27/11519* (2013.01); *H01L 27/11524* (2013.01); *H01L 27/11551* (2013.01); *H01L 27/11565* (2013.01); *H01L 27/11582* (2013.01)

(56) References Cited

U.S. PATENT DOCUMENTS

| | | |
|---|---|---|
| 9,368,509 B2 | 6/2016 | Pang et al. |
| 9,679,907 B1 | 6/2017 | Kaneko |
| 2009/0179257 A1 | 7/2009 | Komori et al. |
| 2012/0098050 A1 | 4/2012 | Shim et al. |
| 2016/0204122 A1 | 7/2016 | Shoji et al. |
| 2017/0125433 A1 | 5/2017 | Ogawa et al. |
| 2017/0148808 A1 | 5/2017 | Nishikawa et al. |
| 2017/0148809 A1 | 5/2017 | Nishikawa et al. |
| 2017/0148810 A1 | 5/2017 | Kai et al. |

OTHER PUBLICATIONS

Lee et al., "A Sub-1-volt Nanoelectrochemical Switching Device," Nature Nanotechnology, vol. 8, Jan. 2013.
Chen et al., "Advanced HDP STI Gap-fill Development in 65mn Logic Device," ECS Trans., 27 (1) 679 (2010).
U.S. Appl. No. 15/078,555, filed Mar. 23, 2016, SanDisk Technologies LLC.
U.S. Appl. No. 15/155,639, filed May 16, 2016, SanDisk Technologies LLC.
U.S. Appl. No. 15/286,063, filed Oct. 5, 2016, SanDisk Technologies LLC.
U.S. Appl. No. 15/332,429, filed Oct. 24, 2016, SanDisk Technologies LLC.
U.S. Appl. No. 15/337,235, filed Oct. 28, 2016, SanDisk Technologies LLC.
U.S. Appl. No. 15/354,067, filed Nov. 17, 2016, SanDisk Technologies LLC.
U.S. Appl. No. 15/354,795, filed Nov. 17, 2016, SanDisk Technologies LLC.
U.S. Appl. No. 15/468,732, filed Mar. 24, 2017, SanDisk Technologies LLC.
International Search Report and Written Opinion of the International Searching Authority for International Patent Application No. PCT/US2018/019885, dated May 30, 2018, 18 pages.

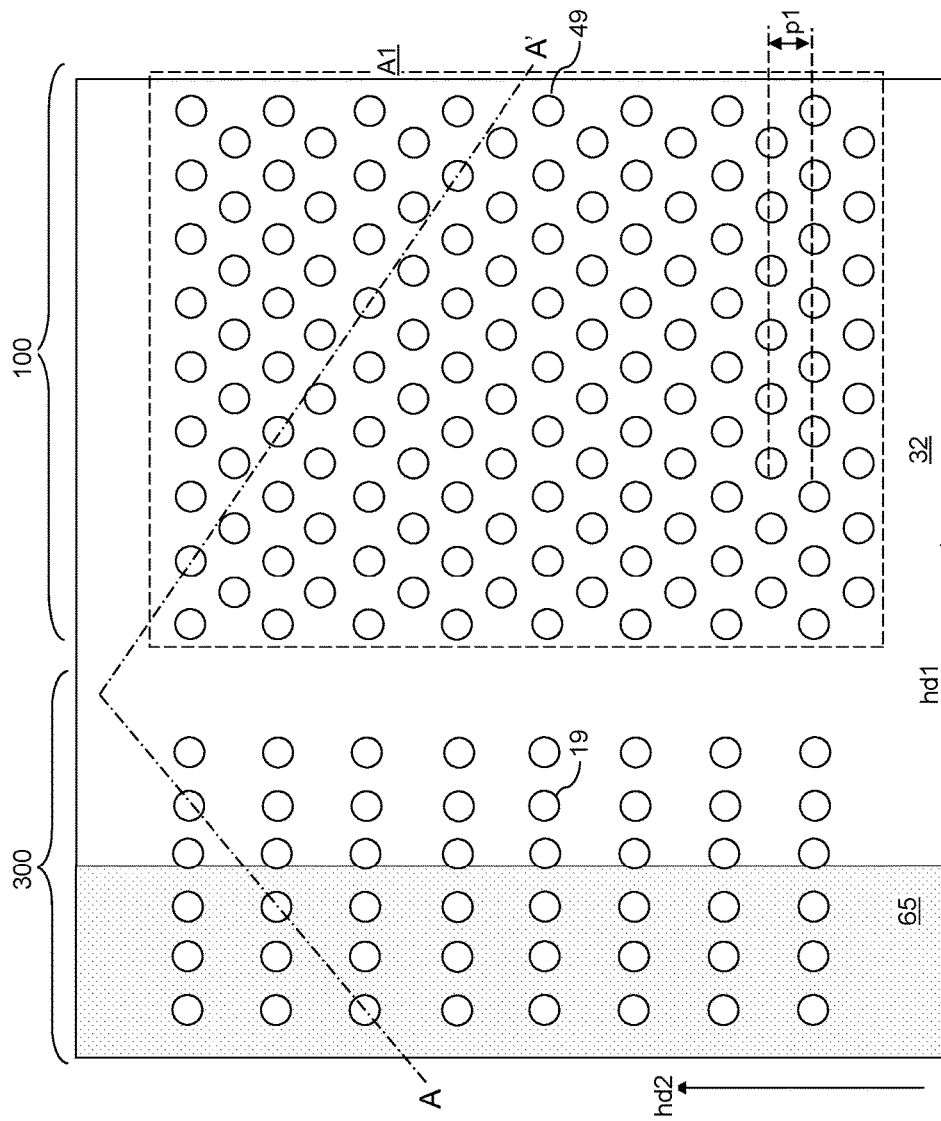

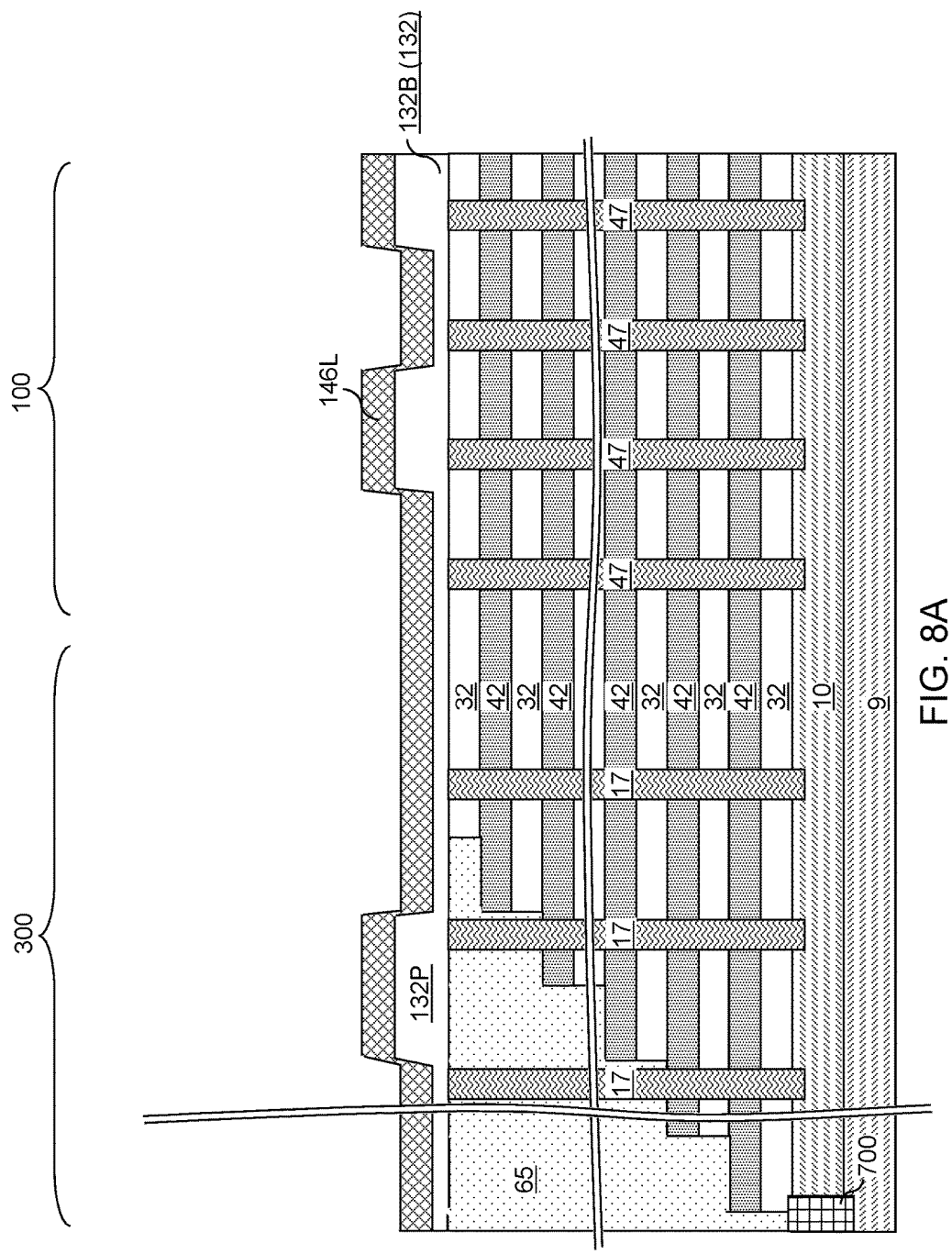

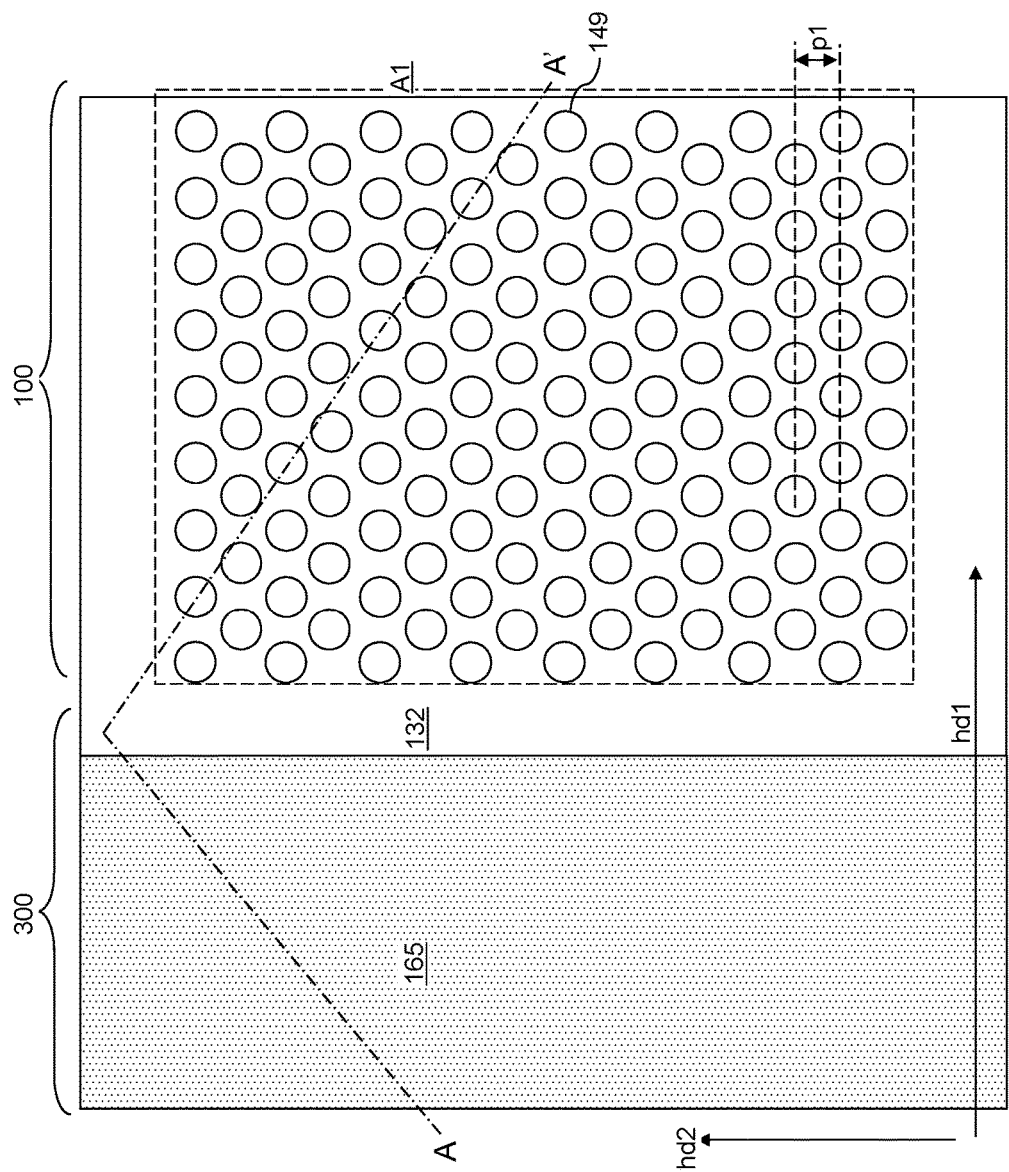

THREE-DIMENSIONAL MEMORY DEVICE INCLUDING VERTICALLY OFFSET DRAIN SELECT LEVEL LAYERS AND METHOD OF MAKING THEREOF

FIELD

The present disclosure relates generally to the field of semiconductor devices, and particular to a three-dimensional memory device including vertically offset drain select level layers and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and stack level electrically conductive layers located over a top surface of a substrate; first drain select level electrically conductive layers and second drain select level electrically conductive layers that are vertically offset and located over the alternating stack, wherein the second drain select level electrically conductive layers are vertically offset from the first drain select level electrically conductive layers and are located in areas that do not overlap with the first drain select level electrically conductive layers in a plan view along a direction perpendicular to the top surface of the substrate; a first set of memory stack structures extending through the alternating stack and the first drain select level electrically conductive layers; and a second set of memory stack structure extending through the alternating stack and the second set of electrically conductive layers.

According to another aspect of the present disclosure, a monolithic three-dimensional NAND memory device comprises an alternating stack of insulating layers and word lines located over a top surface of a substrate, a first vertical NAND string which extends through the alternating stack and contacts all word lines in the alternating stack, and a second vertical NAND string which extends through the alternating stack and contacts all word lines in the alternating stack. A first drain select gate electrode contacts the first vertical NAND string but not the second vertical NAND string. A second drain select gate electrode contacts the second vertical NAND string but not the first vertical NAND string. The second drain select gate electrode is vertically offset from the first drain select gate electrode in the direction perpendicular to the top surface of the substrate. The first drain select gate electrode is the bottommost drain select gate electrode that contacts the first vertical NAND string. The second drain select gate electrode is the bottommost drain select gate electrode that contacts the second vertical NAND string.

According to another aspect of the present disclosure, a method of forming a three-dimensional memory device is provided. An alternating stack of insulating layers and stack level spacer material layers is formed over a top surface of a substrate, wherein the stack level spacer material layers are formed as, or are subsequently replaced with, stack level electrically conductive layers. A bottommost insulating spacer layer is formed over the alternating stack, wherein the bottommost insulating spacer layer has protruding portions that laterally extend along a first horizontal direction and laterally spaced apart among one another by grooves that extend along the first horizontal direction. A conductive material is anisotropically deposited over the bottommost insulating spacer. The conductive material is isotropically etched to physically expose portions of the sidewalls of the protruding portions of the bottommost insulating spacer, wherein portions of the conductive material overlying the grooves constitute first drain select level electrically conductive layers and portions of the conductive material overlying the protruding portions of the bottommost insulating spacer constitute second drain select level electrically conductive layers. Memory stack structures are formed through the first and second drain select level electrically conductive layers and through the alternating stack.

BRIEF DESCRIPTION OF THE DRAWINGS

FIG. 4B is a top-down view of the exemplary structure of FIG. 4A. The vertical plane A-A' is the plane of the cross-section for FIG. 4A.

FIG. 8A is a schematic vertical cross-sectional view of the exemplary structure after anisotropically depositing a conductive material on the bottommost insulating spacer layer according to an embodiment of the present disclosure.

FIG. 14B is a top-down view of the exemplary structure of FIG. 14A. The zig-zag vertical plane A-A' is the plane of the schematic vertical cross-sectional view of FIG. 14A.

DETAILED DESCRIPTION

Figure 1:
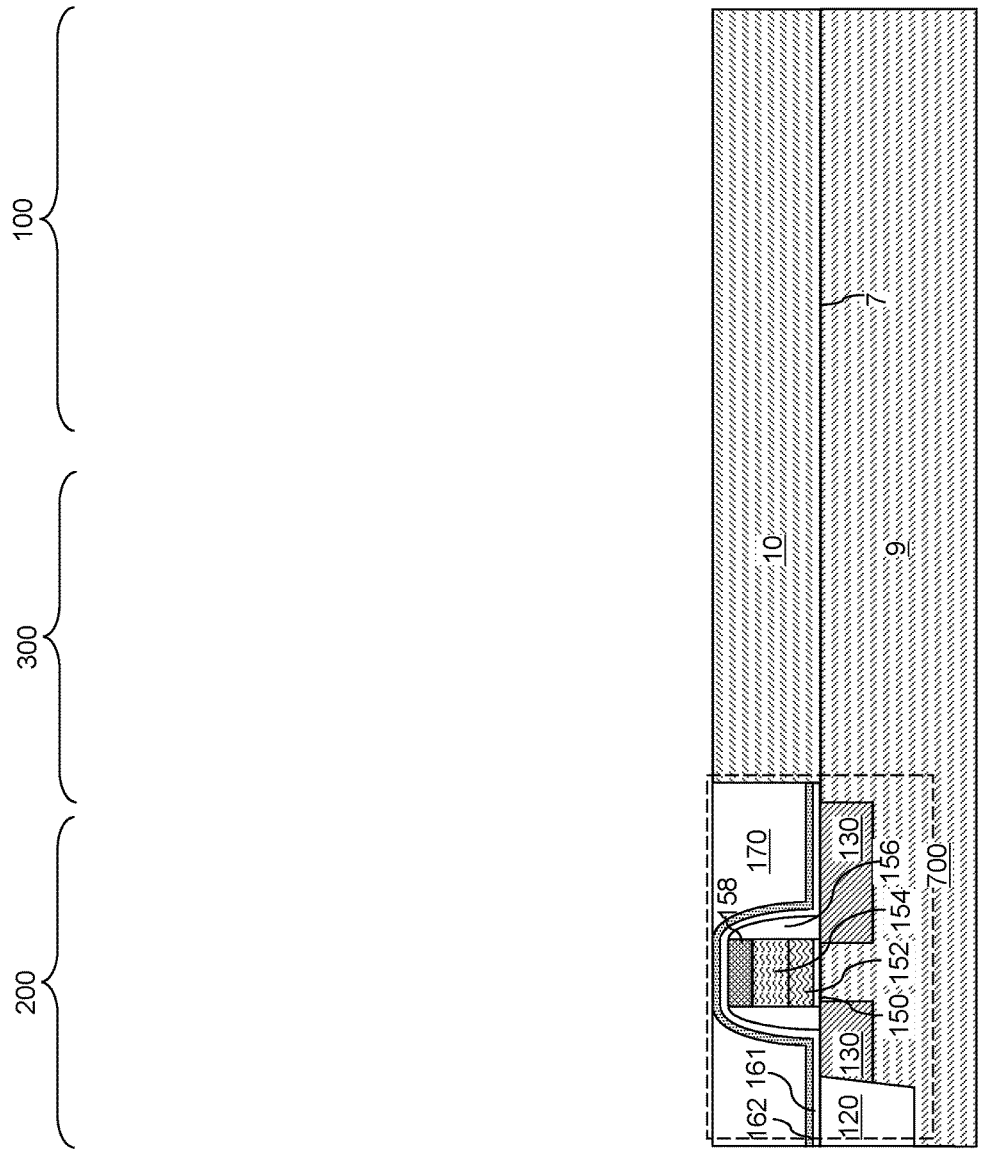
FIG. 1 is a schematic vertical cross-sectional view of an exemplary structure after formation of at least one peripheral device and a semiconductor material layer according to an embodiment of the present disclosure.

Drain select level electrically conductive layers are drain side select gate electrodes ("SGD gates") which are used to activate a selected group of memory stack structures (e.g., selected vertical NAND strings) while deactivating all unselected groups of memory stack structures (e.g., unselected vertical NAND strings) that are connected to a common source node of a three-dimensional memory device, such as three-dimensional NAND memory device. Multiple drain select level electrically conductive layers are employed for each area of the three-dimensional memory device that is accessed by a common set of vertically stacked word lines. Neighboring drain select level electrically conductive layers (e.g., SGD gates for neighboring NAND strings) are electrically isolated from each other to ensure activation of only the select group of memory stack structures during operation of the memory device. Shallow trench isolation structures are typically employed to provide electrical isolation between the adjacent drain select level electrically conductive layers in the same device level. However, each shallow trench isolation structure has a significant width, and areas employed for shallow trench isolation structures are not employed to form memory stack structures (e.g., vertical NAND strings), which decreases the NAND string density.

Embodiments of the present disclosure provide electrical isolation among the drain select level electrically conductive layers (e.g., SGD gates) while providing more available areas for the memory stack structures (e.g., vertical NAND strings) in a three-dimensional memory device. Thus, embodiments of present disclosure include a three-dimensional memory device containing separately formed drain side select transistors and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with electrical dopants of a first conductivity type, which can be p-type or n-type, The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer can be formed above the semiconductor material layer 10 and the planarization dielectric layer 170. The gate dielectric layer can be, for example, silicon oxide layer. The thickness of the gate dielectric layer can be in a range from 3 nm to 30 nm, although lesser and greater thicknesses can also be employed.

Figure 2:
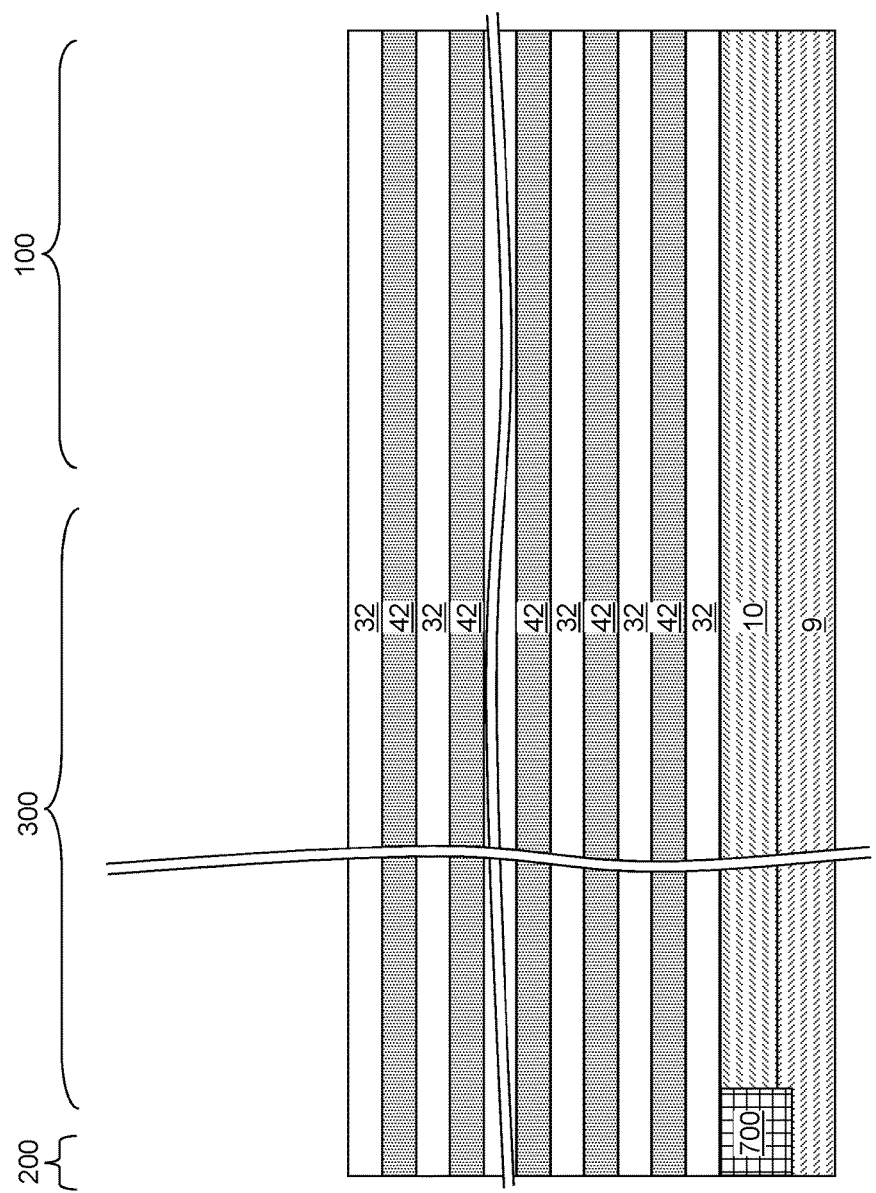
FIG. 2 is a schematic vertical cross-sectional view of the exemplary structure after formation of an alternating stack of insulating layers and stack level sacrificial material layers according to an embodiment of the present disclosure.

Referring to FIG. 2, a stack of an alternating plurality of first material layers (which can be insulating layers 32) and second material layers (which can be stack level sacrificial material layer 42) is formed over the top surface of the substrate. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality. As used herein, a "stack level" element refers to an element that is formed at one of the levels of an alternating stack of material layers. As used herein, a "word line level" element refers to an element that is formed at a level of a word line that is present or to be subsequently formed.

Each first material layer includes a first material, and each second material layer includes a second material that is different from the first material. In one embodiment, each first material layer can be an insulating layer 32, and each second material layer can be a stack level sacrificial material layer. In this case, the stack can include an alternating plurality of insulating layers 32 and stack level sacrificial material layers 42, and constitutes a prototype stack of alternating layers comprising insulating layers 32 and stack level sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and stack level sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the stack level sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The stack level sacrificial material layers 42 may comprise an insulating material, a semiconductor material, or a conductive material. The second material of the stack level sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the stack level sacrificial material layers 42 can be stack level spacer material layers that comprise silicon nitride or a semiconductor material including at least one of silicon and germanium.

In one embodiment, the insulating layers 32 can include silicon oxide, and stack level sacrificial material layers can include silicon nitride stack level sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the stack level sacrificial material layers 42 can be formed, for example, CVD or atomic layer deposition (ALD).

The stack level sacrificial material layers 42 can be suitably patterned so that conductive material portions to be subsequently formed by replacement of the stack level sacrificial material layers 42 can function as electrically conductive electrodes, such as the control gate electrodes of the monolithic three-dimensional NAND string memory devices to be subsequently formed. The stack level sacrificial material layers 42 may comprise a portion having a strip shape extending substantially parallel to the major surface 7 of the substrate.

The thicknesses of the insulating layers 32 and the stack level sacrificial material layers 42 can be in a range from 20 nm to 50 nm, although lesser and greater thicknesses can be employed for each insulating layer 32 and for each stack level sacrificial material layer 42. The number of repetitions of the pairs of an insulating layer 32 and a stack level sacrificial material layer (e.g., a control gate electrode or a stack level sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each stack level sacrificial material layer 42 in the alternating stack (32, 42) can have a uniform thickness that is substantially invariant within each respective stack level sacrificial material layer 42. The alternating stack (32, 42) can terminate with a topmost insulating layer 32.

While the present disclosure is described employing an embodiment in which the stack level spacer material layers are stack level sacrificial material layers 42 that are subsequently replaced with electrically conductive layers, embodiments are expressly contemplated herein in which the stack level sacrificial material layers are formed as electrically conductive layers. In this case, steps for replacing the stack level spacer material layers with electrically conductive layers can be omitted.

Figure 3:
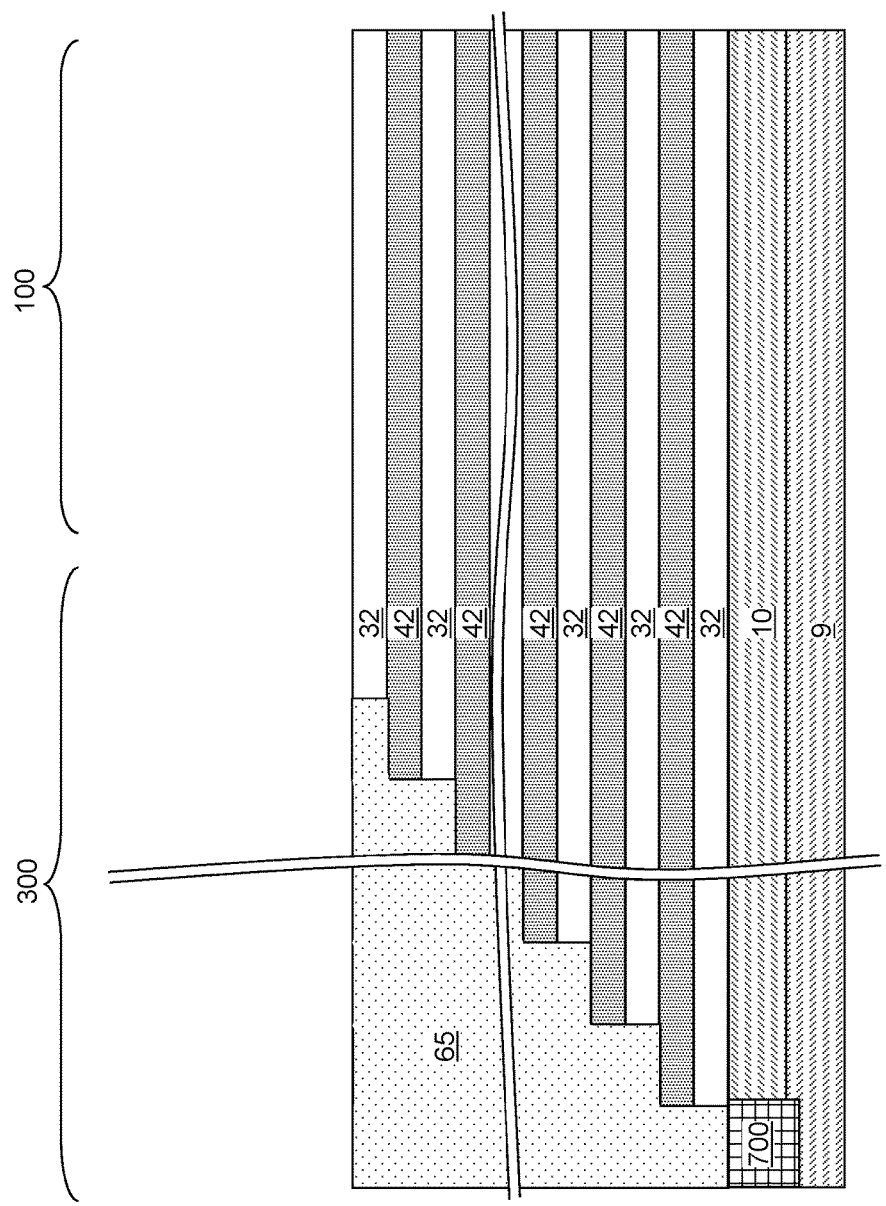
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by applying and patterning a trimmable mask layer (which may be a photoresist layer) and by repetitively performing a set of processing steps. The set of processing steps can include, for example, an anisotropic etch process that vertically increases the depth of a cavity by one or more levels, and an isotropic etch process that trims the trimmable mask layer to laterally expand the area to be vertically etched in a subsequent anisotropic etch process. As used herein, a level of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each stack level sacrificial material layer 42 other than a topmost stack level sacrificial material layer 42 within the alternating stack (32, 42) laterally extends farther than any overlying stack level sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
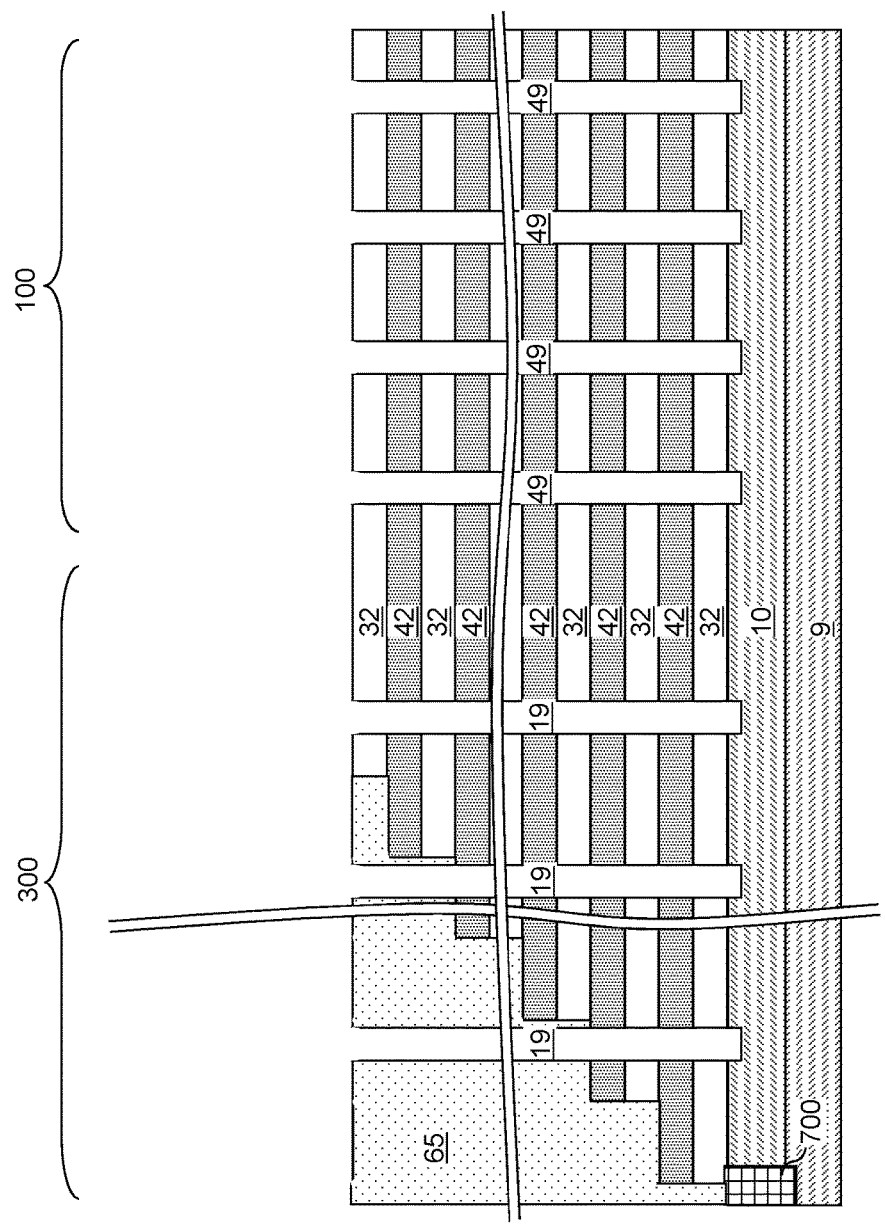
FIG. 4A is a schematic vertical cross-sectional view of the exemplary structure after formation of word line level memory openings and support openings according to an embodiment of the present disclosure.

Referring to FIGS. 4A and 4B, a lithographic material stack (not shown) including at least a photoresist layer can be formed over the topmost insulating layer 32 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form word line level memory openings 49 and support openings 19.

As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. A "word line level memory opening" is a portion of a memory opening that is formed through word line levels, i.e., levels at which word lines are to be subsequently formed. The word line level memory openings 49 are formed through the topmost insulating layer 32 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The word line level memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the word line level memory openings 49 and the support openings 19 can be substantially vertical, or can be tapered. The patterned lithographic material stack can be subsequently removed, for example, by ashing.

The word line level memory openings 49 and the support openings 19 extend from the top surface of the alternating openings (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the word line level memory openings 49 and the support openings 19 can be coplanar with the topmost surface of the semiconductor material layer 10.

Each of the word line level memory openings 49 and the support openings 19 may include a sidewall (or a plurality of sidewalls) that extends substantially perpendicular to the topmost surface of the substrate. A two-dimensional array A1 of word line level memory openings 49 is formed, which includes a two-dimensional array A1 of word line level memory openings 49 formed in the memory array region 100 and a two-dimensional array of support openings 19 formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the word line level memory openings 49 and the support openings 19 can be extend to a top surface of the substrate semiconductor layer 9.

In one embodiment, the word line level memory openings 49 can be formed as a two-dimensional periodic array A1 including rows that extend along a first horizontal direction hd1 and having a uniform inter-row pitch (which is herein referred to as a first pitch p1) along a second horizontal direction hd2, which can be perpendicular to the first horizontal direction hd1. In one embodiment, a plurality of two-dimensional periodic arrays A1 (only one is shown in FIG. 4B) can be formed such that each two-dimensional periodic array is formed as a cluster that is laterally spaced from a neighboring two-dimensional periodic array along the second horizontal direction hd2. Each two-dimensional periodic array A1 can include respective rows that extend along the first horizontal direction hd1 and have a uniform inter-row pitch (i.e., the first pitch p1) along the second horizontal direction hd2.

In one embodiment, the word line level memory openings 49 within each array of memory openings A1 can be arranged in rows that extend along the first horizontal direction hd1 with a first row-to-row pitch (i.e., the first pitch p1) along the second horizontal direction hd2 across an area defined by a neighboring pair of areas in which memory openings are absent. A lower backside trench can be subsequently formed within each of the areas in which memory openings are absent. In one embodiment, each array of word line level memory openings 49 can be formed as a hexagonal array.

Figure 5A:
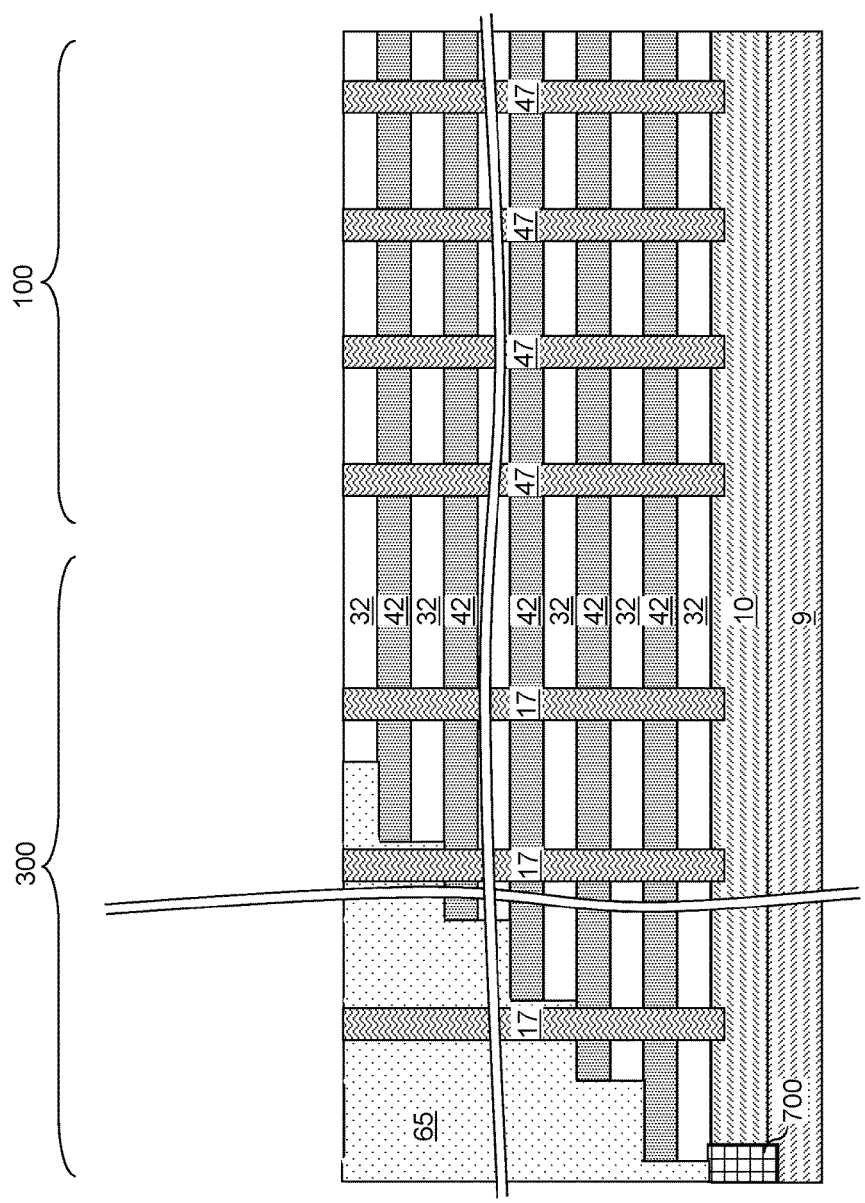
FIG. 5A is a schematic vertical cross-sectional view of the exemplary structure after formation of sacrificial memory opening fill structures and support pillar structures according to an embodiment of the present disclosure.
Figure 5B:
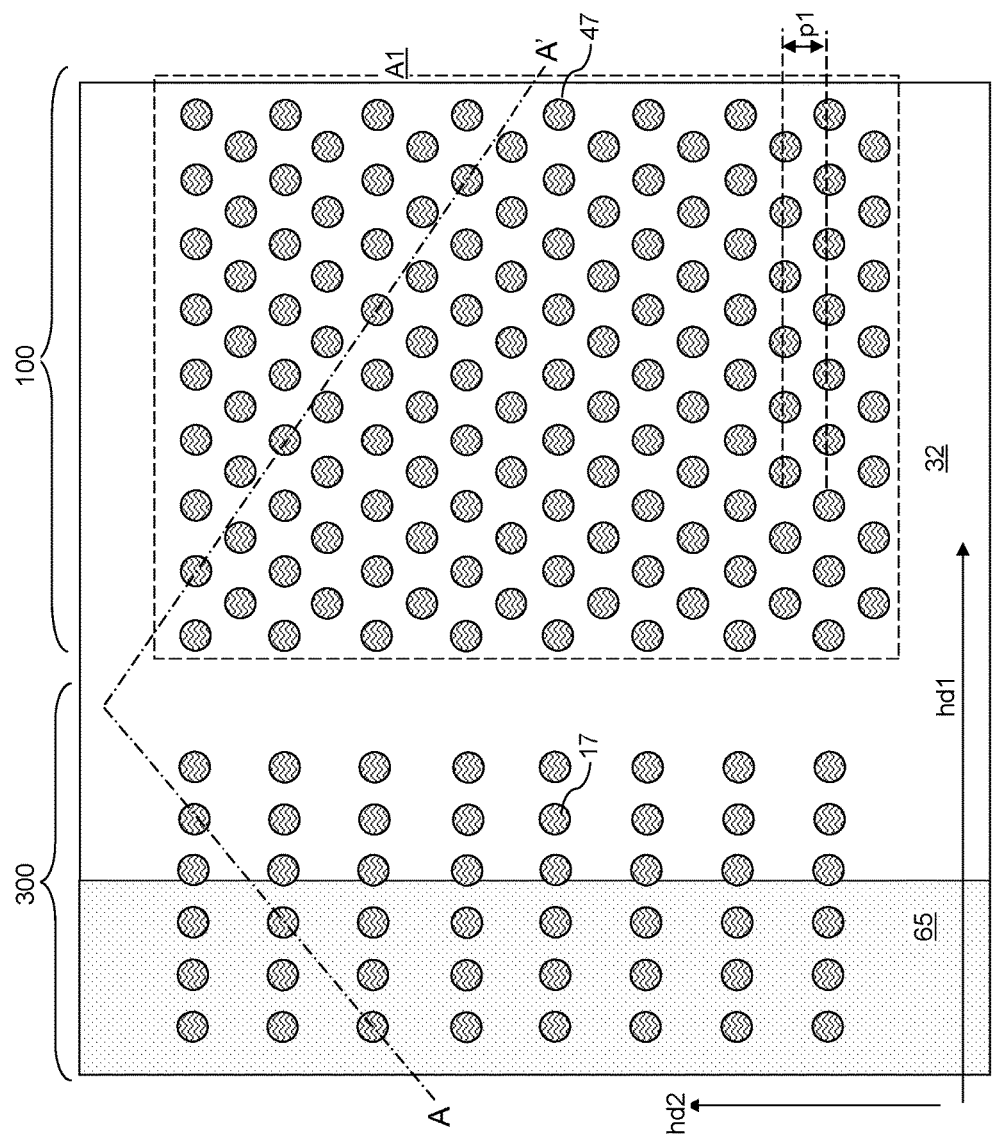
FIG. 5B is a top-down view of the exemplary structure of FIG. 5A. The vertical plane A-A' is the plane of the cross-section for FIG. 5A.

Referring to FIGS. 5A and 5B, a sacrificial material can be deposited in the word line level memory openings 49 and the support openings 19. The sacrificial material can be a material that can be removed selective to the materials of the insulating layers 32 and the stack level sacrificial material layers 42. For example, the sacrificial material can be a semiconductor material such as amorphous silicon, polysilicon, or a silicon-germanium alloy. Alternatively, porous or non-porous organosilicate glass (OSG) may be employed as the sacrificial material. Optionally, a thin sacrificial liner (not shown) may be deposited before deposition of the sacrificial material in the word line level memory openings 49 and the support openings 19. If employed, the thin sacrificial liner may include a dielectric material such as silicon oxide, and may have a thickness in a range from 1 nm to 6 nm, although lesser and greater thicknesses can also be employed. Excess portions of the sacrificial material can be removed from above the topmost insulating layer 32 by a planarization process, which can be a recess etch and/or chemical mechanical planarization. Each remaining portion of the sacrificial material in the word line level memory openings 49 constitutes a sacrificial memory opening fill structure 47. Each remaining portion of the sacrificial material in the support openings 19 constitutes a support pillar structure 17.

Figure 6:
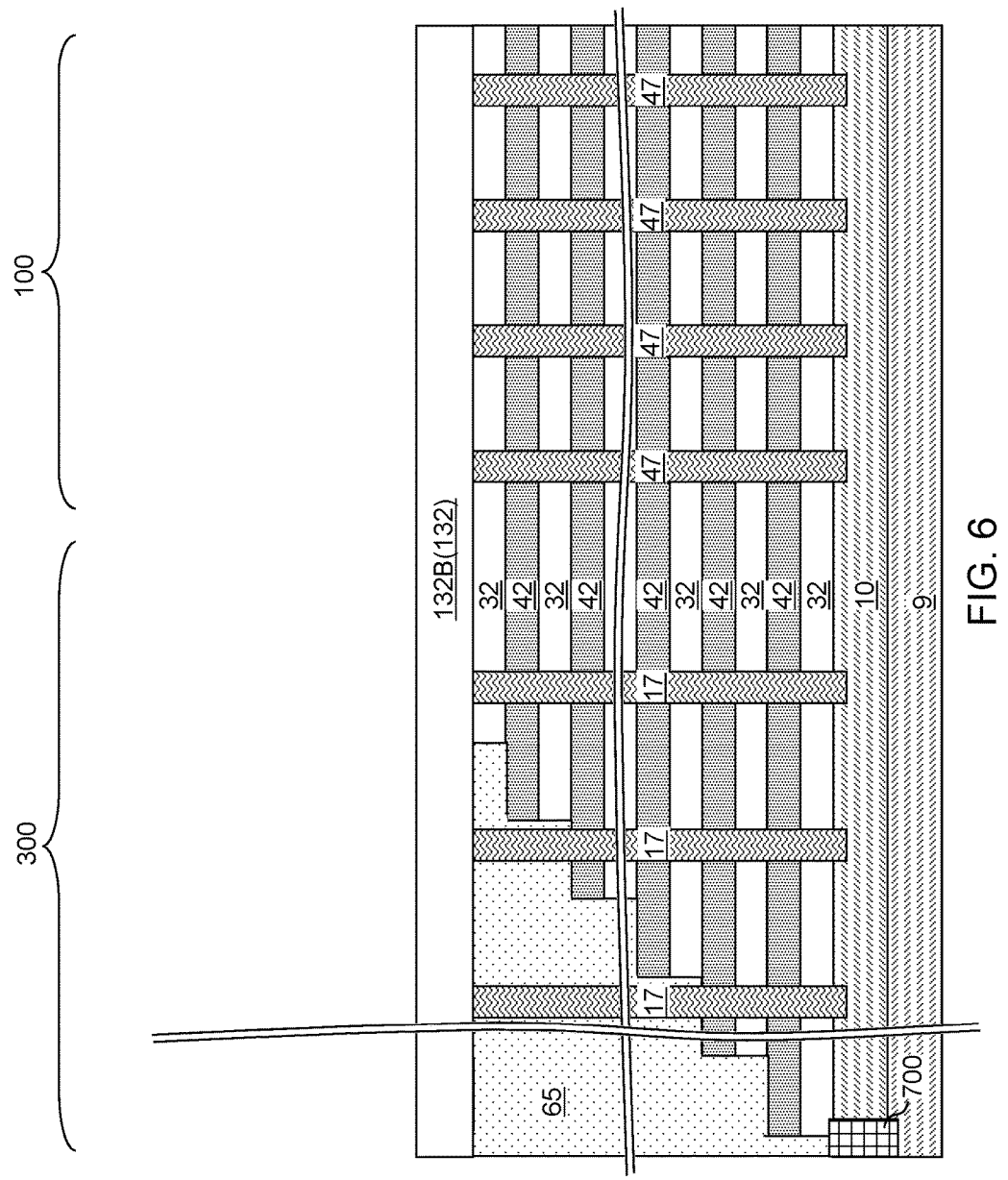
FIG. 6 is a schematic vertical cross-sectional view of the exemplary structure after formation of a bottommost insulating spacer layer according to an embodiment of the present disclosure.

Referring to FIG. 6, a dielectric material layer is deposited over the alternating stack (32, 42) and the retro-stepped dielectric material portion 65. The dielectric material layer is a bottommost insulating layer among insulating spacer layers 132 formed above the alternating stack (32, 42), and is herein referred to as a bottommost insulating spacer layer 132B. The bottommost insulating spacer layer 132B includes a dielectric material that is different from the material of the stack level sacrificial material layers 42. For example, the bottommost insulating spacer layer 132B can include silicon oxide. The bottommost insulating spacer layer 132B can be deposited as a blanket insulating layer (i.e., an unpatterned insulating layer having a same thickness throughout) by a conformal or non-conformal deposition method, and can have a thickness in a range from 30 nm to 600 nm, although lesser and greater thicknesses can also be employed.

Figure 7A:
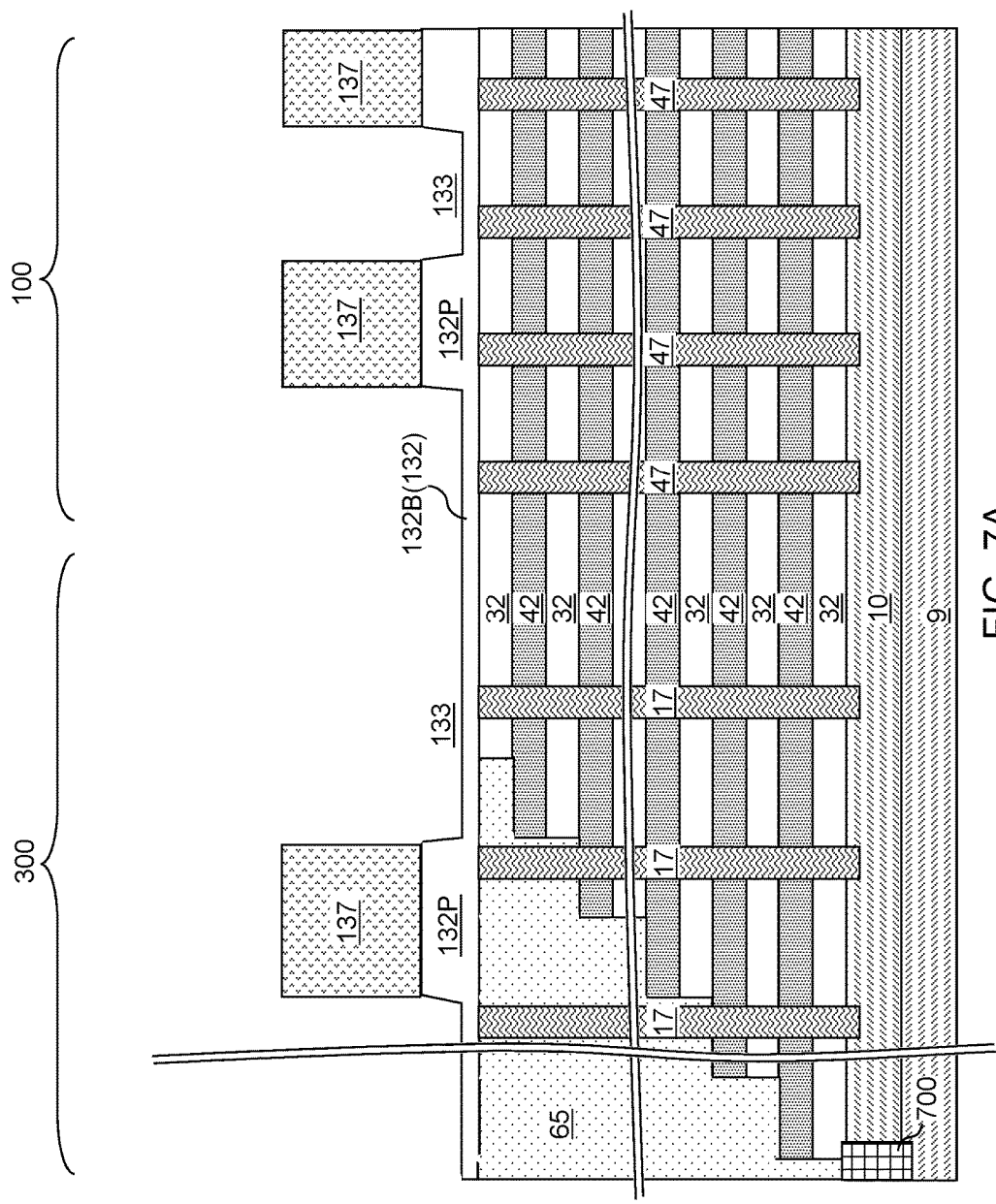
FIG. 7A is a schematic vertical cross-sectional view of the exemplary structure after formation of grooves in the bottommost insulating spacer layer according to an embodiment of the present disclosure.
Figure 7B:
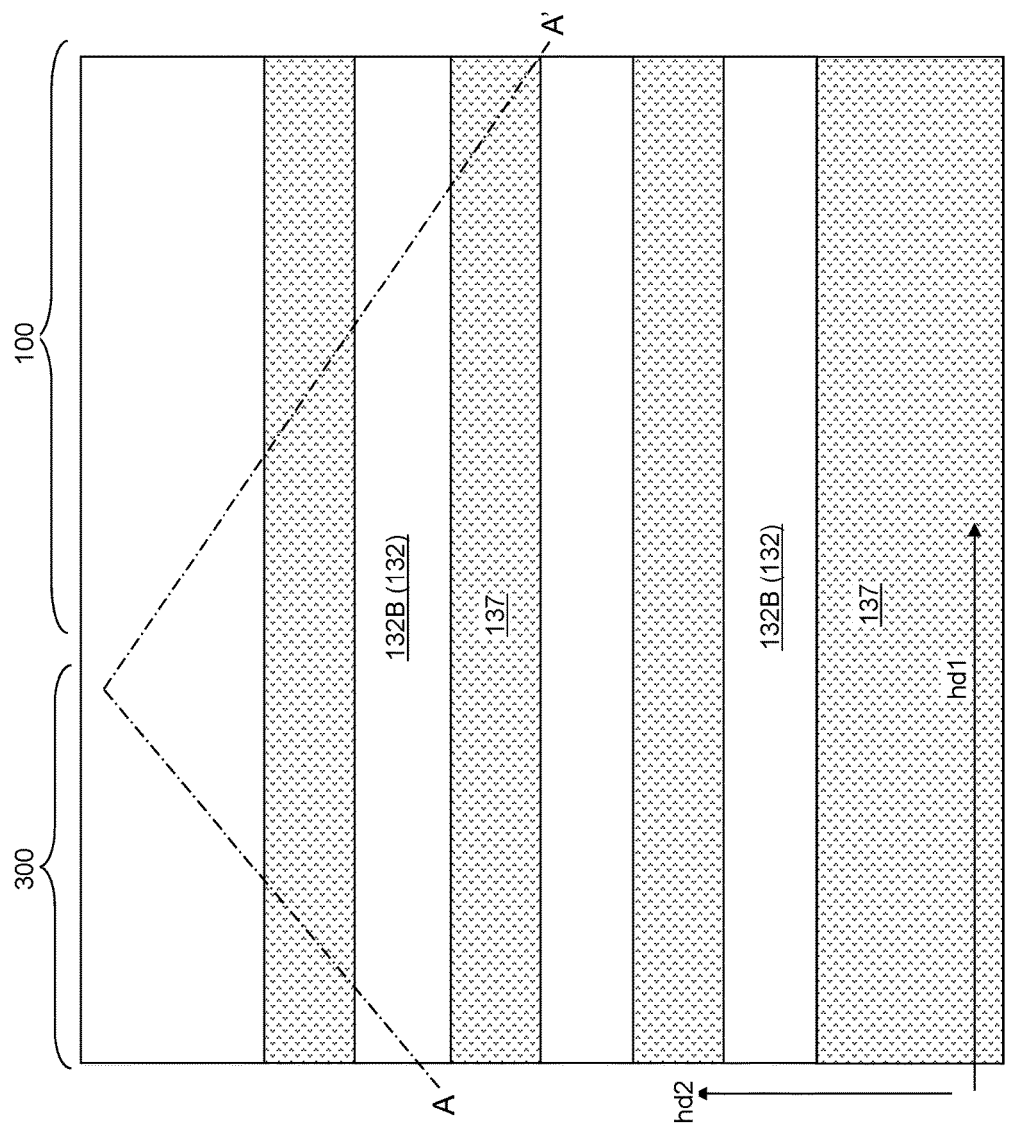
FIG. 7B is a top-down view of the exemplary structure of FIG. 7A. The vertical plane A-A' is the plane of the cross-section for FIG. 7A.

Referring to FIGS. 7A and 7B, a photoresist layer 137 is applied over the bottommost insulating spacer layer 132B, and can be patterned by lithographic exposure and development. The patterned photoresist layer 137 can have a pattern of strips of uniform width that extend along the first horizontal direction hd1 (e.g., word line direction). The patterned photoresist material portions extend along the first horizontal direction hd1 and have a respective uniform width along the second horizontal direction hd2 (e.g., bit line direction) that is perpendicular to the first horizontal direction hd1.

Portions of the bottommost insulating spacer layer 132B, which is a blanket insulating spacer as initially formed, that are not covered by the patterned photoresist material portions are partially etched to form the grooves 133 between remaining protruding portions (e.g., rails) 132P of the bottommost insulating spacer layer 132B. An anisotropic etch such as a reactive ion etch can be performed to vertically recess portions of the bottommost insulating spacer layer 132B to form grooves having a respective uniform width and a respective uniform depth. The anisotropic etch can have an isotropic etch component that provides collateral lateral etching. In this case, the sidewalls of the protruding portion 132P of the bottommost insulating spacer layer have a respective taper angle in a range from 5 degrees to 45 degrees with respect to a vertical direction that is perpendicular to the top surface of the substrate, although lesser non-zero angles and greater angles can also be employed. In one embodiment, the taper angle can be in a range from 10 degrees to 30 degrees. After formation of the grooves 133 that extend partially through the bottommost insulating spacer layer 132B, layer 132B has protruding portions 132P that laterally extend along the first horizontal direction hd1 and laterally spaced apart among one another by grooves 133 that extend along the first horizontal direction hd1.

Figure 8B:
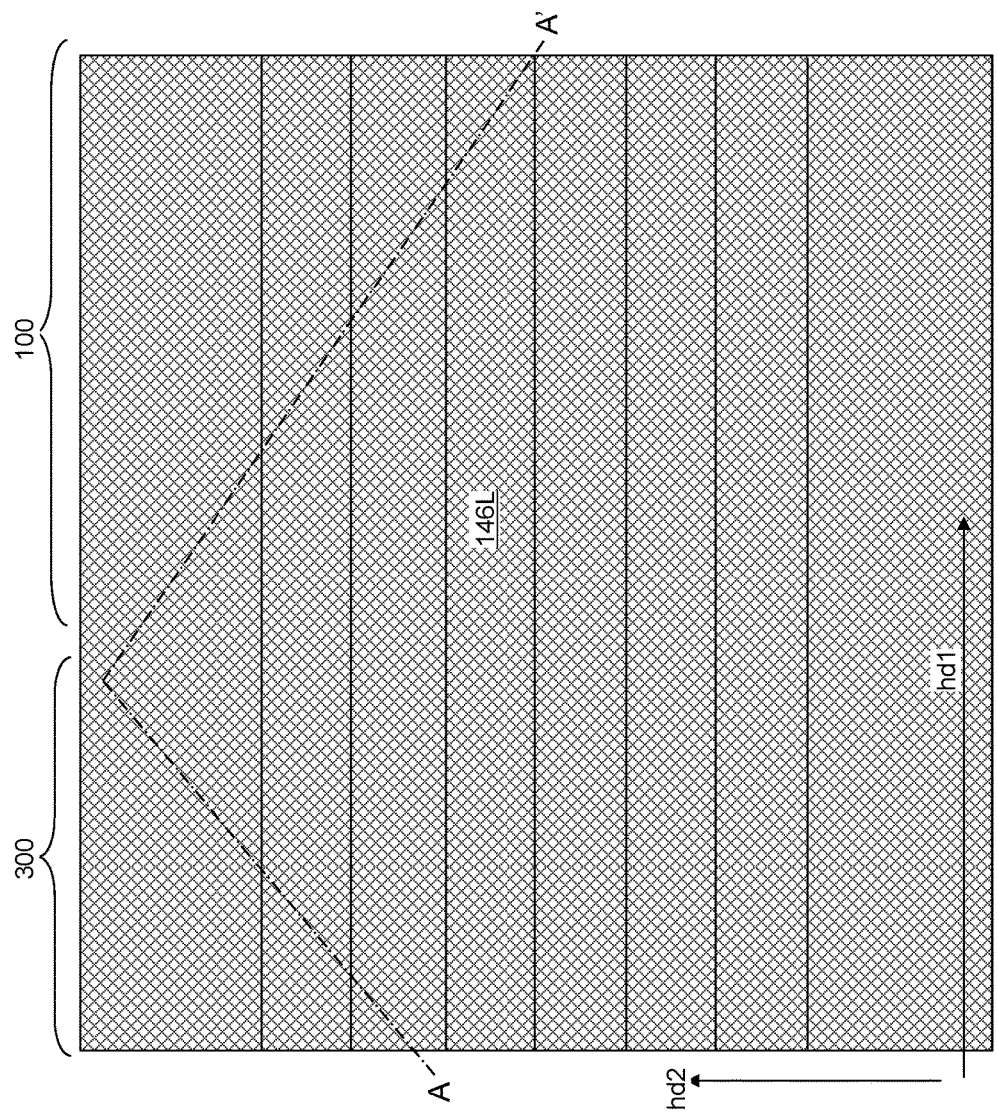
FIG. 8B is a top-down view of the exemplary structure of FIG. 8A. The vertical plane A-A' is the plane of the cross-section for FIG. 8A.

Referring to FIGS. 8A and 8B, a conductive material can be anisotropically (e.g., directionally) deposited on the bottommost insulating spacer 132B. The conductive material can be a metallic material such as tungsten, or can be a heavily doped semiconductor material such as doped polysilicon. The method of the anisotropic deposition can be physical vapor deposition (PVD), such as sputtering, or vacuum evaporation employing an effusion cell or an e-beam evaporation source. Since PVD tungsten contains no fluorine, a metal nitride barrier, such as a titanium nitride barrier, may be omitted. The anisotropic deposition provides high directionality to the conductive particles that are deposited on the bottommost insulating spacer 132B. The deposited conductive material forms a conductive material layer 146L. The high directionality of the deposition process induces thickness differential for the deposited conductive material between regions overlying horizontal surfaces (e.g., the bottom surfaces of the grooves 133 and the top surfaces of the protruding portions 132P) of the bottommost insulating spacer layer 132B and regions overlying sidewalls of the bottommost insulating spacer layer 132B. For example, the thickness of the deposited conductive material on each sidewall of the protruding portions 132P of the bottommost insulating spacer layer 132B, as measured along a direction perpendicular to the sidewall of the protruding portions 132P of the bottommost insulating spacer layer 132B, can be in a range from 1% to 50%, such as from 5% to 30%, of the thickness of the horizontal portions of the deposited conductive material on the horizontal surfaces of the bottommost insulating spacer layer 132B, as measured along the vertical direction. The thickness of the horizontal portions of the conductive material layer 146L can be less than the thickness of the protruding portion of the bottommost insulating spacer layer 132B. In one embodiment, the thickness of the horizontal portions of the conductive material layer 146L can be in a range from 20% to 80% of the thickness of the protruding portion of the bottommost insulating spacer layer 132B. In one embodiment, the thickness of the horizontal portions of the conductive material layer 146L may be in a range from 20 nm to 100 nm, such as from 30 nm to 500 nm, although lesser and greater thicknesses can also be employed. In one embodiment, the thickness of the sidewall portions of the conductive material layer 146L may be in a range from 1 nm to 20 nm, such as from 2 nm to 10 nm, although lesser and greater thicknesses can also be employed.

Figure 9A:
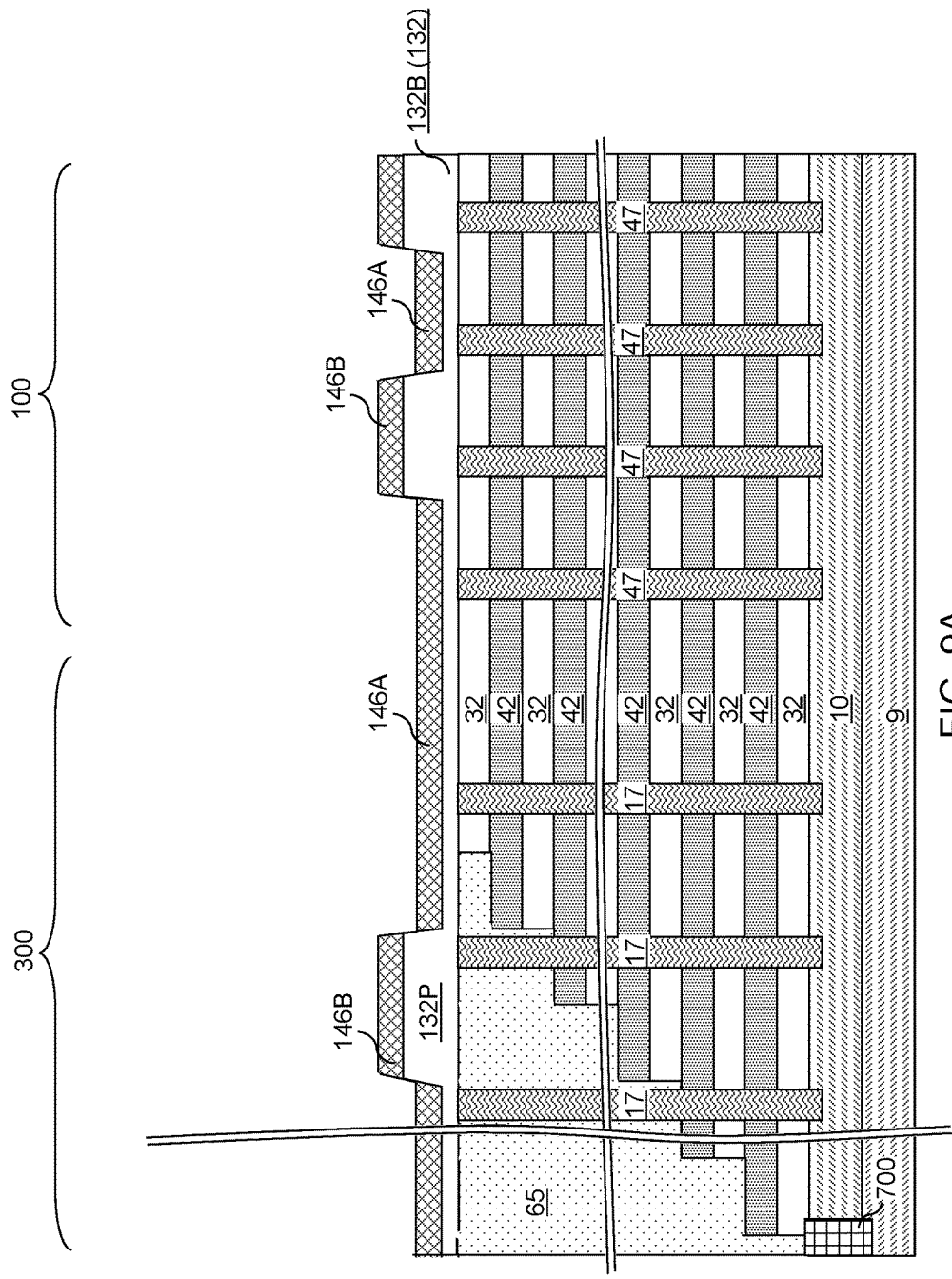
FIG. 9A is a schematic vertical cross-sectional view of the exemplary structure after isotropically etching the conductive material partially to form drain select level electrically conductive layers according to an embodiment of the present disclosure.
Figure 9B:
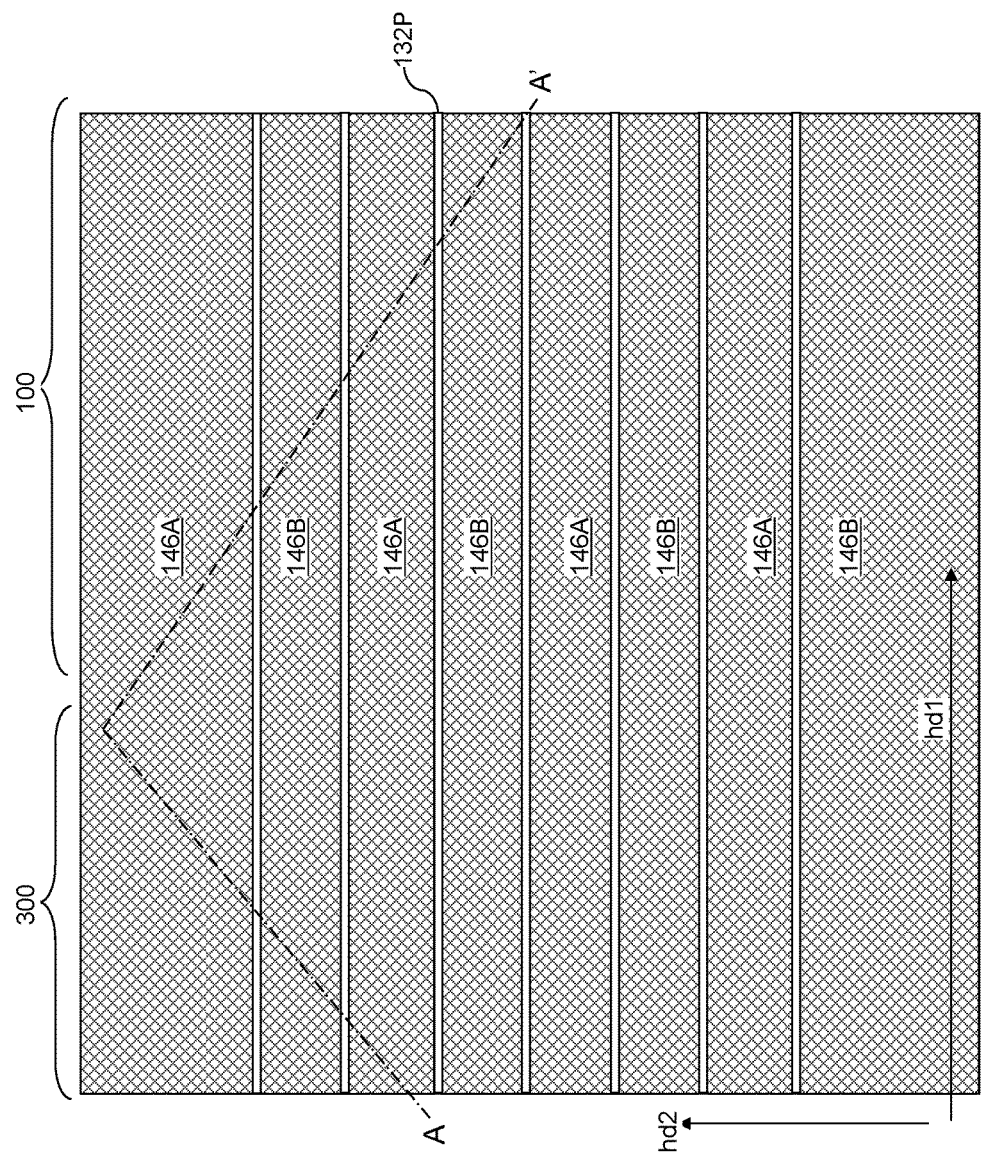
FIG. 9B is a top-down view of the exemplary structure of FIG. 9A. The vertical plane A-A' is the plane of the cross-section for FIG. 9A.

Referring to FIGS. 9A and 9B, the conductive material layer 146L is isotropically etched partially to remove portions of the conductive material layer 146L from over the sidewalls of the protruding portion 132P of the bottommost insulating spacer layer 132B. A wet etch process or an isotropic dry etch process (such as chemical dry etch) may be employed to etch back the material of the conductive material layer selective to the dielectric material of the bottommost insulating spacer layer 132B. The duration of the isotropic etch process is selected such that the sidewalls of the protruding portion 132P of the bottommost insulating spacer layer 132B are physically exposed, and horizontal portions of the conductive material layer 146L remain after the isotropic etch process. Thus, the conductive material layer 146L is disconnected above each sidewall of the protruding portion 132P of the bottommost insulating spacer layer 132B to form conductive strips having a respective uniform width.

The conductive strips include first drain select level electrically conductive layers 146A that are formed within the grooves 133 of the bottommost insulating spacer layer 132B and second drain select level electrically conductive layers 146B that are formed above the protruding portions 132P of the bottommost insulating spacer layer 132B. In other words, portions of the conductive material overlying the grooves constitute the first drain select level electrically conductive layers (e.g., first drain select gate electrodes of a vertical NAND string) 146A, and portions of the conductive material overlying the protruding portions of the bottommost insulating spacer 132B constitute the second drain select level electrically conductive layers (e.g., second drain select gate electrodes of another vertical NAND string) 146B. As used herein, a "drain select level" refers to the level at which a drain select level gate electrode of a drain side select gate transistor ("SGD") is present, or is to be subsequently formed. The thickness of the first drain select level electrically conductive layers 146A can be the same as the thickness of the second drain select level electrically conductive layers 146B. In one embodiment, the thickness of the first and second drain select level electrically conductive layers (146A, 146B) can be in a range from 50% to 90% of the thickness of the horizontal portion of the conductive material layer 146L. In one embodiment, the thickness of the first and second drain select level electrically conductive layers (146A, 146B) may be in a range from 15 nm to 90 nm, such as from 25 nm to 35 nm, although lesser and greater thicknesses can also be employed. In one embodiment, each of the first drain select level electrically conductive layers 146A has an inverse trapezoidal vertical cross-sectional shape within a vertical plane perpendicular to the first horizontal direction hd1, and each of the second drain select level electrically conductive layers 146B has a trapezoidal vertical cross-sectional shape within the vertical plane perpendicular to the first horizontal direction hd1. As used herein, a trapezoidal shape refers to a shape of a quadrangle having a top side and a bottom side that are parallel to each other such that the top side is shorter than the bottom side. As used herein, an inverse trapezoidal shape refers to a shape of a quadrangle having a top side and a bottom side that are parallel to each other such that the top side is longer than the bottom side.

Figure 10A:
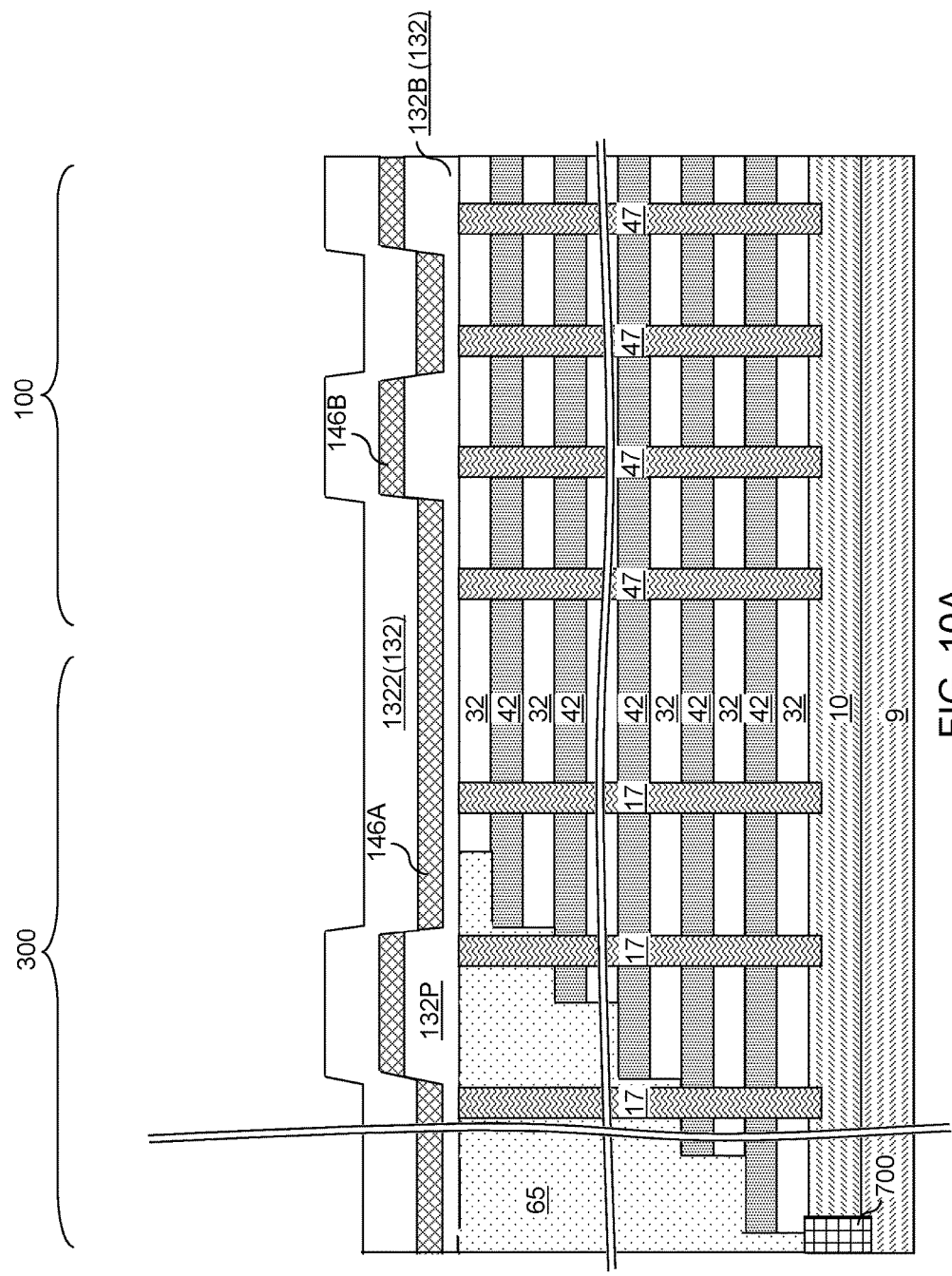
FIG. 10A is a schematic vertical cross-sectional view of the exemplary structure after anisotropically depositing an insulating spacer layer according to an embodiment of the present disclosure.
Figure 10B:
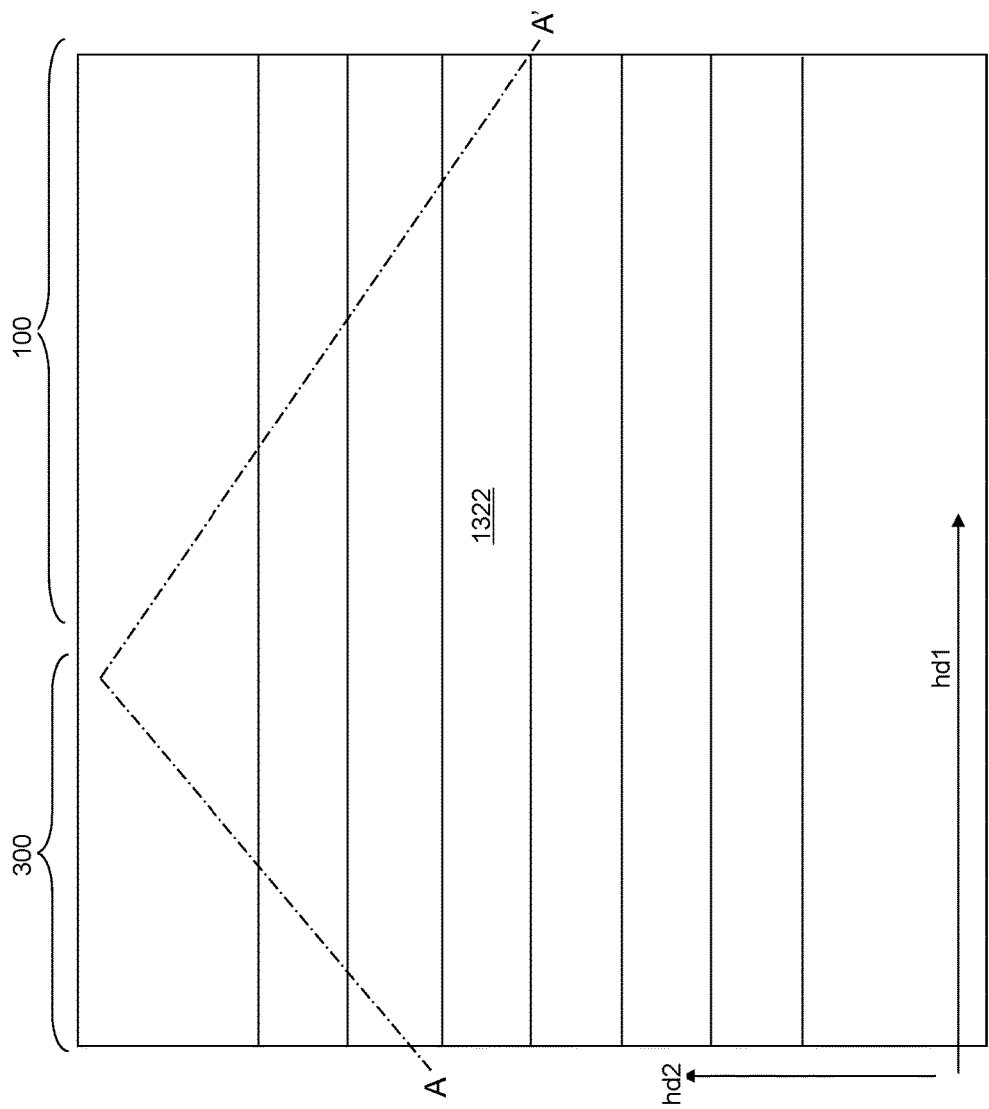
FIG. 10B is a top-down view of the exemplary structure of FIG. 10A. The vertical plane A-A' is the plane of the cross-section for FIG. 10A.

Referring to FIGS. 10A and 10B, an insulating material can be anisotropically (e.g., conformally and/or directionally) deposited over the first and second drain select level electrically conductive layers (146A, 146B) to form another insulating spacer layer 1322, which is also referred to as a second insulating spacer layer 1322. The second insulating spacer layer 1322 and the bottommost insulating spacer layer 132B are insulating spacer layers 132. The deposited insulating material is different from the material of the stack level sacrificial material layers 42, and may, or may not, be the same as the material of the bottommost insulating spacer material layer 132B. The method of the anisotropic deposition can be, for example, collimated physical vapor deposition (PVD). The anisotropic deposition provides high directionality to the insulating material that is deposited on the first and second drain select level electrically conductive layers (146A, 146B) and on physically exposed portions of the protruding portions 132P of the sidewalls of the bottommost insulating spacer 132B. The deposited insulating material forms the second insulating spacer layer 1322. The high directionality of the deposition process induces thickness differential for the deposited insulating material between regions overlying the first and second drain select level electrically conductive layers (146A, 146B) and regions overlying sidewalls of the protruding portions 132P of the bottommost insulating spacer layer 132B. For example, the thickness of the deposited second insulating spacer layer 1322 on each sidewall of the protruding portion 132P of the bottommost insulating spacer layer 132B, as measured along a direction perpendicular to the sidewall of the second insulating spacer layer 1322, can be in a range from 1% to 50%, such as from 5% to 30%, of the thickness of the horizontal portions of the second insulating spacer layer 1322, as measured along the vertical direction. The thickness of the second insulating spacer layer 1322 can be greater than the thickness of the first and second drain select level electrically conductive layers (146A, 146B). In one embodiment, the thickness of the horizontal portions of the second insulating spacer layer 1322 can be in a range from 30 nm to 200 nm, although lesser and greater thicknesses can also be employed.

Figure 11:
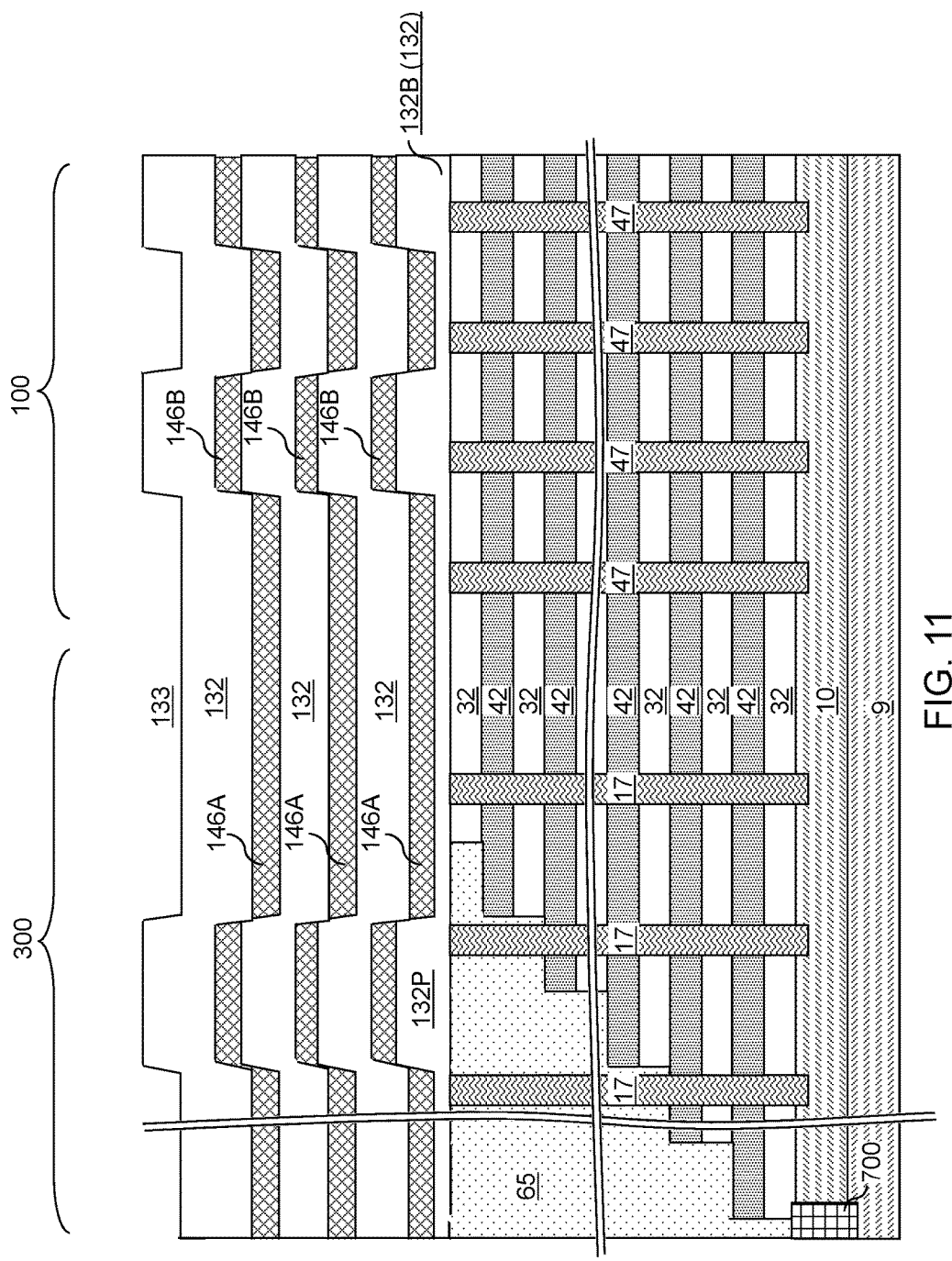
FIG. 11 is a schematic vertical cross-sectional view of the exemplary structure after formation of additional drain select level electrically conductive layers and additional insulating spacer layers according to an embodiment of the present disclosure.

Referring to FIG. 11, the combination of the processing steps of FIGS. 9A and 9B and the processing steps of FIGS. 10A and 10B may be optionally repeated at least once to form additional drain select level electrically conductive layers (146A, 146B) and additional insulating spacer layers 132. Each repetition of the processing steps of FIGS. 9A and 9B forms a set of additional first drain select level electrically conductive layers 146A that are formed within grooves of an underlying insulating spacer layer 132 and additional second drain select level electrically conductive layers 146B that are formed over protruding portions of the underlying insulating spacer layer 132. Each repetition of the processing steps of FIGS. 9A and 9B forms additional drain select level electrically conductive layers (146A, 146B) over two drain select levels (e.g., four or more levels of the select gate electrodes). In other words, each set of additional first drain select level electrically conductive layers 146A and each set of additional second drain select level electrically conductive layers 146B can be formed by anisotropically depositing an additional conductive material over a respective underlying insulating spacer layer 132, and by isotropically etching the additional conductive material to physically expose portions of the sidewalls of the respective additional insulating spacer layer 132. Each repetition of the processing steps of FIGS. 10A and 10B forms an additional insulating spacer layer 132. In one embodiment, each of the additional first drain select level electrically conductive layers 146A has an inverse trapezoidal vertical cross-sectional shape within a vertical plane perpendicular to the first horizontal direction hd1, and each of the additional second drain select level electrically conductive layers 146B has a trapezoidal vertical cross-sectional shape within the vertical plane perpendicular to the first horizontal direction hd1.

Each additional first drain select level electrically conductive layers 146A overlies underlying first drain select level electrically conductive layers 146A, and each additional second drain select level electrically conductive layers 146B overlies underlying second drain select level electrically conductive layers 146B. In one embodiment, the area of all first drain select level electrically conductive layers 146A does not overlap the area of all second drain select level electrically conductive layers 146B. In one embodiment, the area of each overlapping set of first drain select level electrically conductive layers 146A may be laterally spaced from the area of a neighboring overlapping set of second drain select level electrically conductive layers 146B by the area within which vertically neighboring insulating spacer layers 132 physically contact. In this case, levels of the first drain select level electrically conductive layers 146A (including the additional first drain select level electrically conductive layers 146A) are interlaced with levels of the second drain select level electrically conductive layers 146B. The first drain select level electrically conductive layers 146A are arranged as first multiple strips that are laterally spaced apart within each level in the first set of multiple levels, and the second drain select level electrically conductive layers 146B are arranged as second multiple strips that are laterally spaced part within each level in the second set of multiple levels. Alternatively, the processing steps of FIGS. 9A and 9B and the processing steps of FIGS. 10A and 10B may not be repeated, i.e., the processing steps of FIG. 11 may be omitted to form only two levels of select gate electrodes (e.g., one drain side select gate electrode is formed for each vertical NAND string, where the select gate electrodes of adjacent NAND strings are vertically offset from each other).

Figure 12:
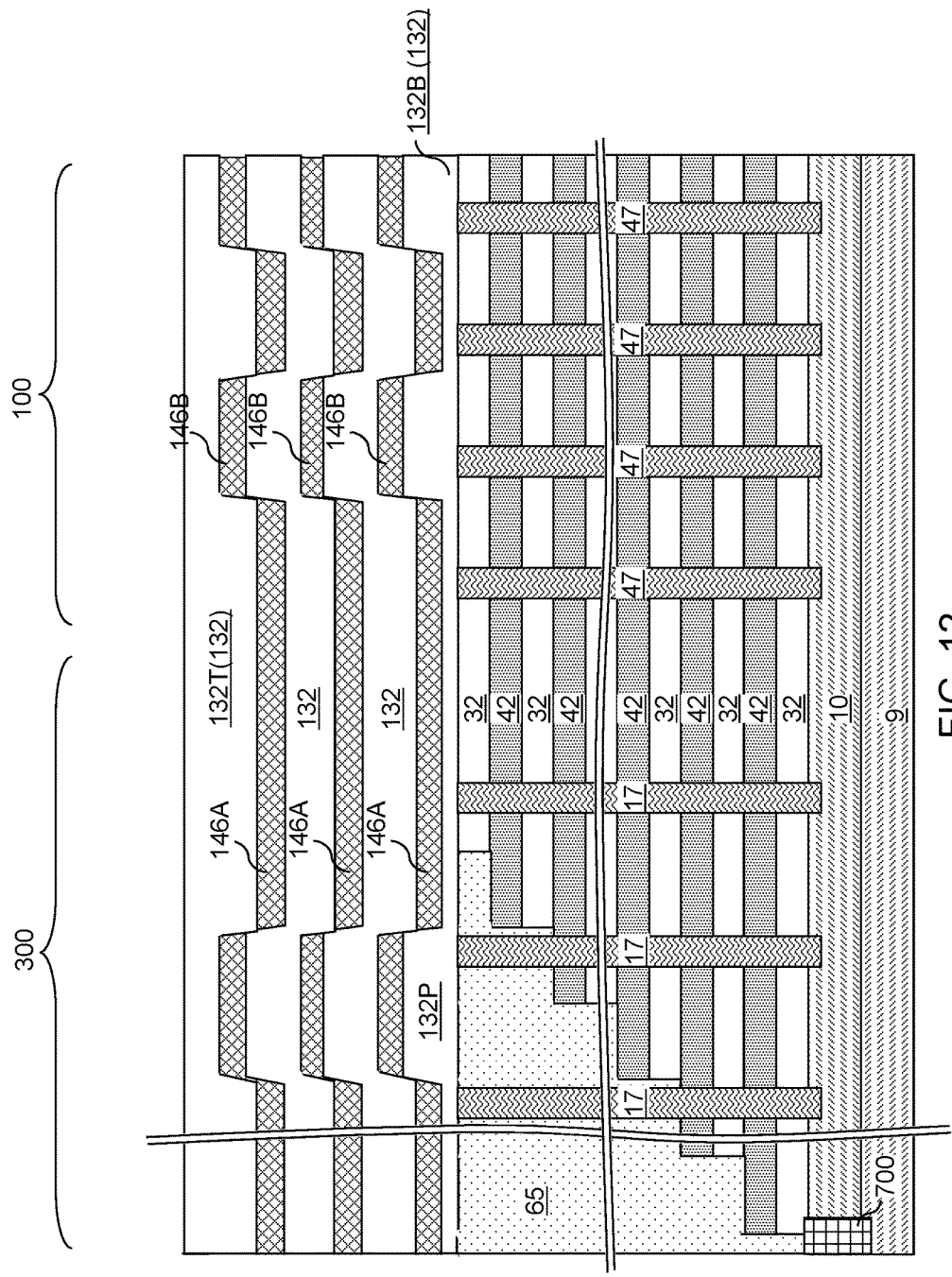
FIG. 12 is a schematic vertical cross-sectional view of the exemplary structure after deposition and planarization of a topmost insulating spacer layer according to an embodiment of the present disclosure.
Figure 13A:
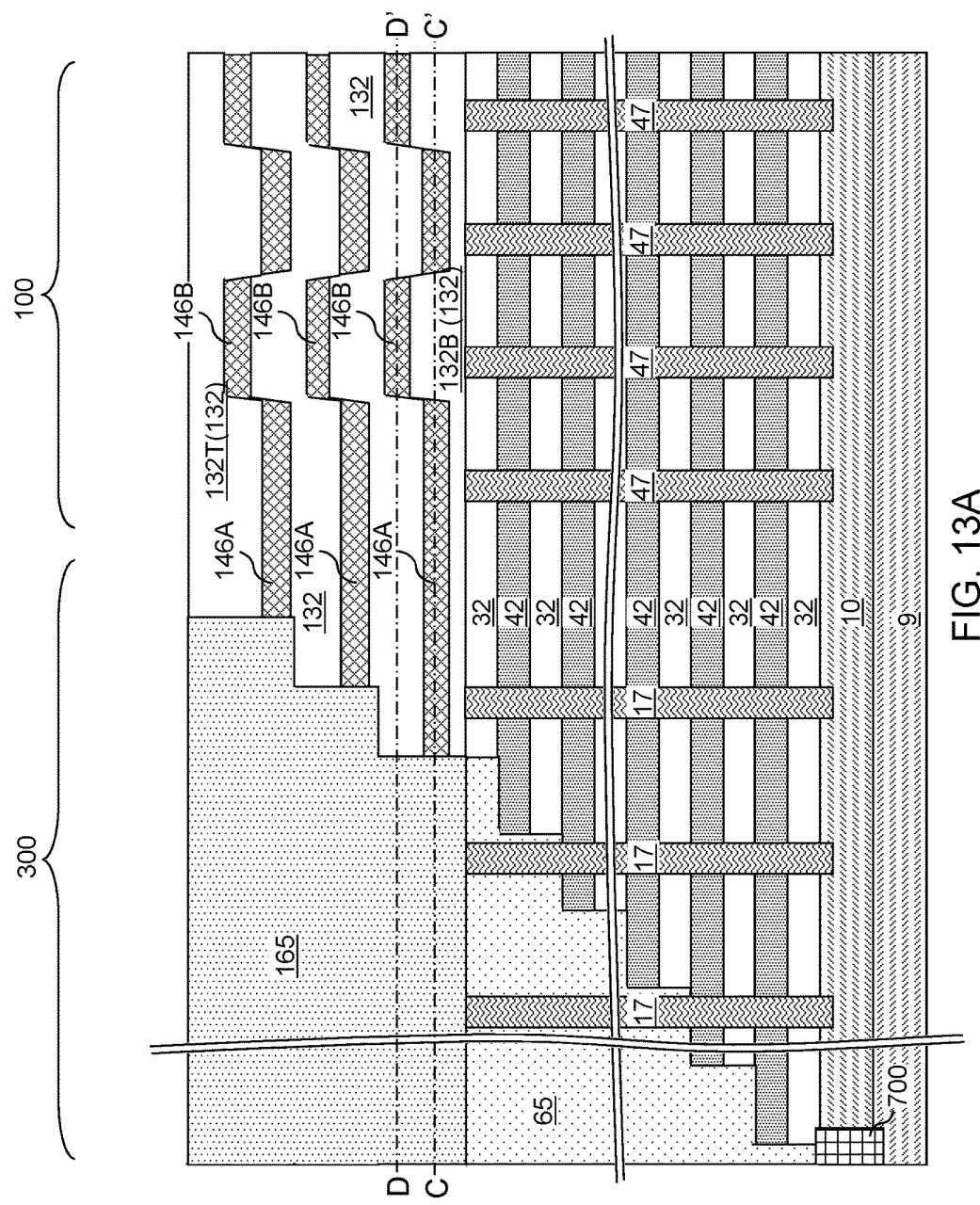
FIG. 13A is a schematic vertical cross-sectional view of the exemplary structure after patterning of the drain select level electrically conductive layers and formation of a drain select level retro-stepped dielectric material portion according to an embodiment of the present disclosure.
Figure 13B:
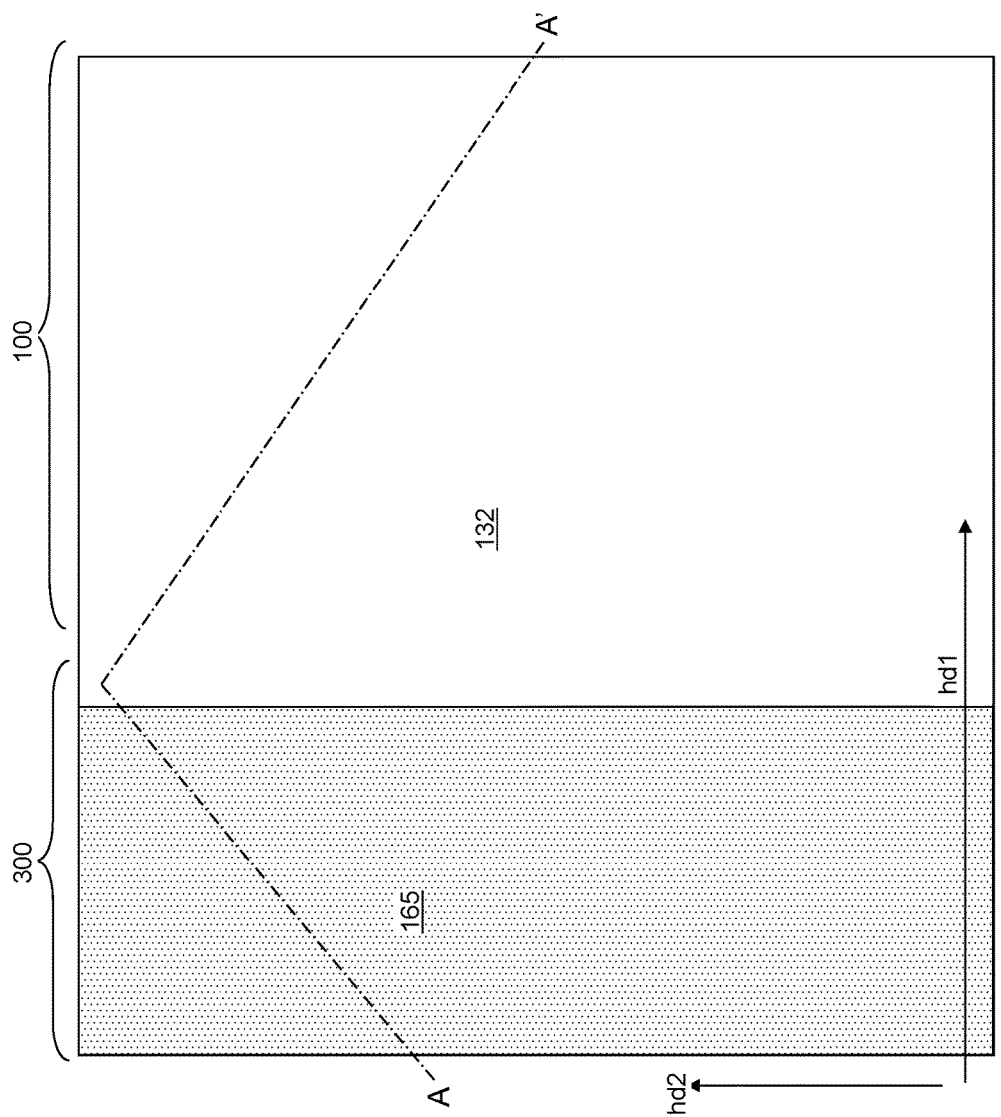
FIG. 13B is a top-down view of the exemplary structure of FIG. 13A. The zig-zag vertical plane A-A' is the plane of the schematic vertical cross-sectional view of FIG. 13A.
Figure 13C:
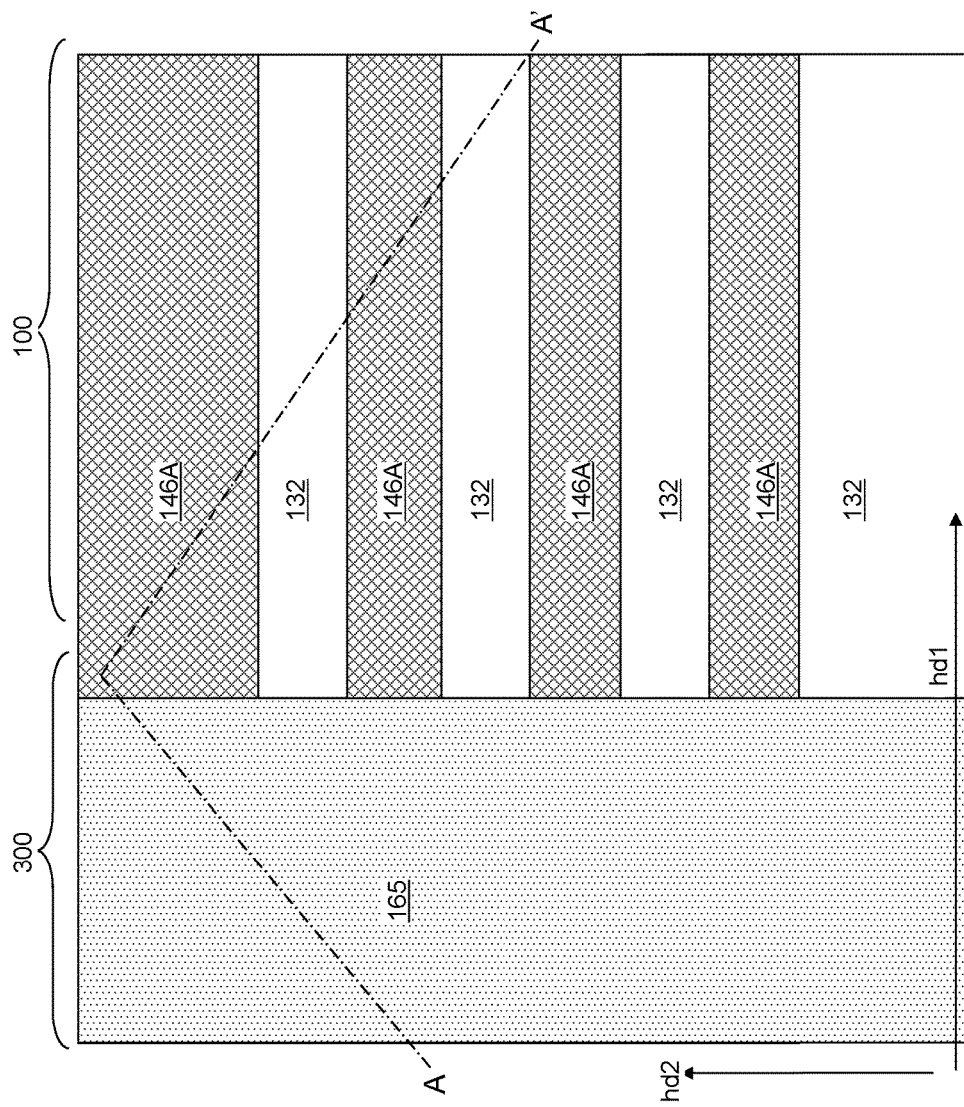
FIG. 13C is a horizontal cross-sectional view of the exemplary structure of FIG. 13A along the horizontal plane C-C'.
Figure 13D:
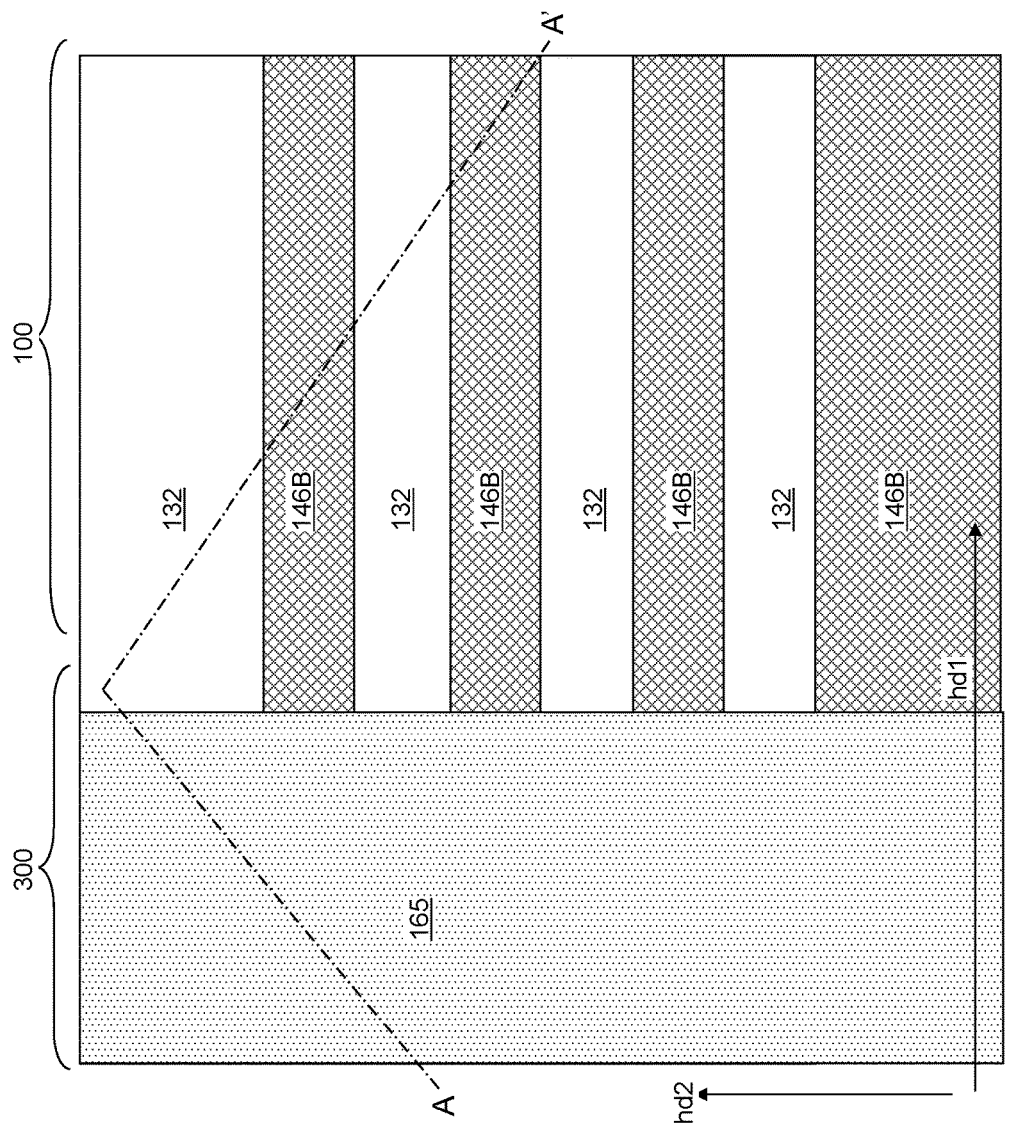
FIG. 13D is a horizontal cross-sectional view of the exemplary structure of FIG. 13B along the horizontal plane D-D'.

Referring to FIG. 12, the topmost insulating spacer layer 132T (i.e., the topmost layer among the insulating spacer layers 132) can be planarized to provide a planar horizontal top surface. For example, chemical mechanical planarization can be performed to provide the planar horizontal top surface for the topmost insulating spacer layer 132T. In one embodiment, the thickness of the topmost insulating spacer layer 132T as deposited can be selected such that the planarized top surface of the topmost insulating spacer layer 132T is formed above the height of the topmost second drain select level electrically conductive layers 146B.

Referring to FIGS. 13A-13D, optional stepped surfaces by patterning the first and second drain select level electrically conductive layers (146A, 146B) that are formed at the processing steps of FIGS. 8A, 8B, 9A, and 9B, at least one set of additional first drain select level electrically conductive layers 146A that are formed at the processing steps of FIG. 11, and the at least one set of additional second drain select level electrically conductive layers that are formed at the processing steps of FIG. 11. Sidewalls of the stepped surfaces laterally extend along the second horizontal direction hd2 that is perpendicular to the first horizontal direction hd1, and are laterally offset among one another along the first horizontal direction hd1. Thus, the drain select level electrically conductive layers (146A, 146B) can be patterned to provide a stepped cavity including stepped surfaces in the contact region 300. Alternatively, the stepped surfaces may be omitted, and instead insulated contact openings extending to different depths at the location of the drain select level electrically conductive layers are formed instead.

In one embodiment, the stepped surfaces can be formed by applying and patterning a trimmable mask layer, and by repetitively performing a set of processing steps. The set of processing steps can include, for example, an anisotropic etch process that vertically increases the depth of a cavity in the contact region 300 by one or more levels, and an isotropic etch process that trims the trimmable etch mask layer. The trimmable mask layer can be subsequently removed. Alternatively, multiple etch mask layers and multiple anisotropic etch processes can also be employed to form the stepped surfaces. The stepped cavity can vertically extend to the top surface of the retro-stepped dielectric material portion 65. In one embodiment, the bottom surface of the stepped cavity may include the entire area of the retro-stepped dielectric material portion 65.

A dielectric material can be deposited in the stepped cavity, and can be planarized to provide a top surface that is coplanar with the top surface of the topmost insulating spacer layer 132T. The remaining portion of the dielectric material is herein referred to as a drain select level retro-stepped dielectric material portion 165. The drain select level retro-stepped dielectric material portion 165 can include a doped silicate glass or an undoped silicate glass.

Figure 14A:
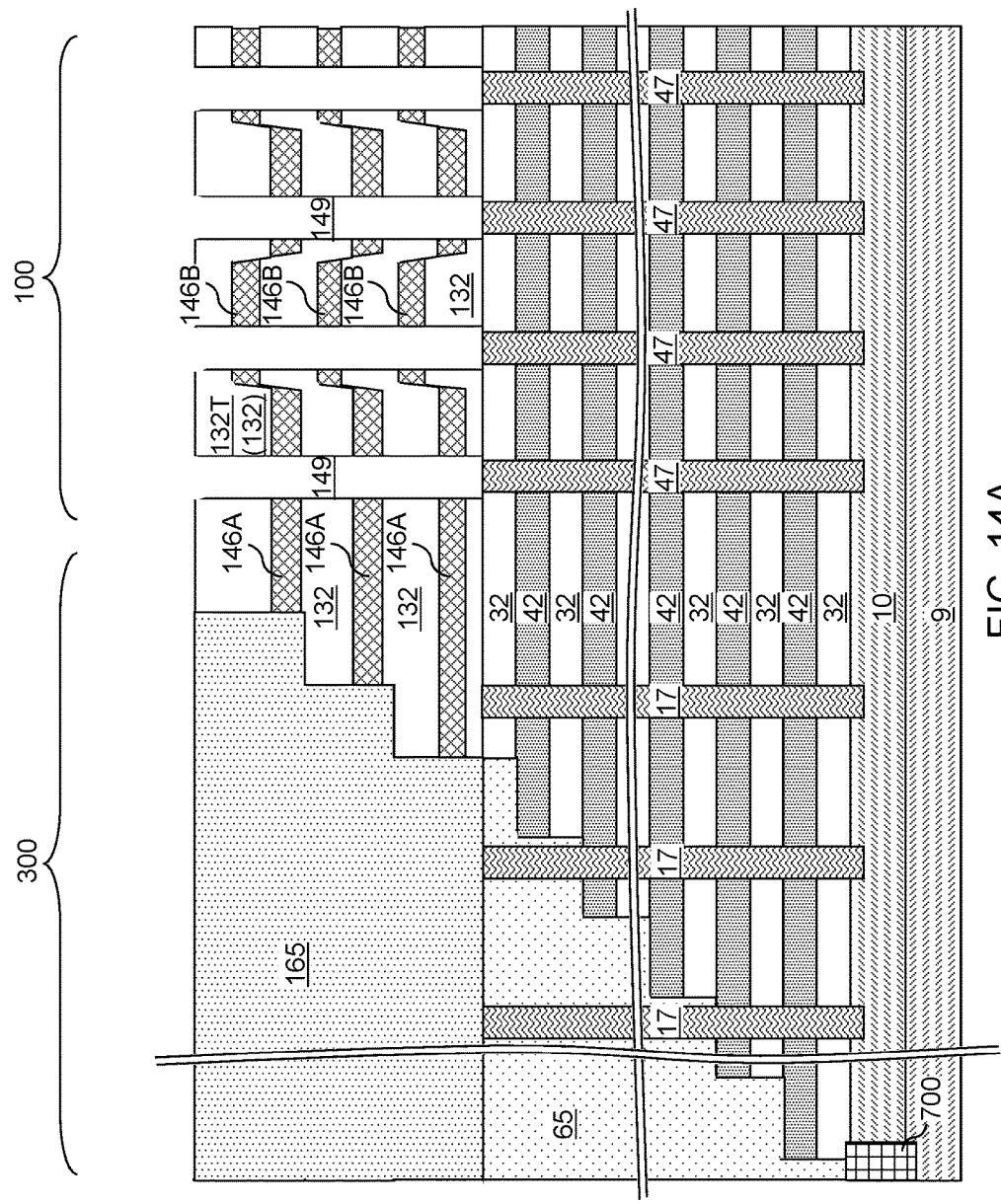
FIG. 14A is a schematic vertical cross-sectional view of the exemplary structure after forming drain select level memory openings according to an embodiment of the present disclosure.

Referring to FIGS. 14A and 14B, drain select level memory openings 149 are formed through the drain select level electrically conductive layers (146A, 146B) and the insulating spacer layers 132. A photoresist layer (not shown) can be applied over the topmost insulating spacer layer 132T, and is lithographically patterned to form openings therethrough. The pattern of the openings includes the pattern of all word line level memory openings 49 and may, or may not, include all or a subset of the pattern of the support openings 19. An anisotropic etch is performed to transfer the pattern of the openings in the photoresist layer through the drain select level electrically conductive layers (146A, 146B) and the insulating spacer layers 132, thereby forming a set of openings that include drain select level memory openings 149. Each drain select level memory opening 149 overlies a respective one of the sacrificial memory opening fill structures 47. In one embodiment, the area of each drain select level memory opening 149 may overly with at least 80%, and preferably more than 90%, of the area of the respective underlying sacrificial memory opening fill structure 47. In one embodiment, each drain select level memory opening 149 can have a greater area than the area of the underlying sacrificial memory opening fill structure 47. In one embodiment, each drain select level memory opening 149 can have an area that include the entire area of the underlying sacrificial memory opening fill structure 47.

Optionally and not necessarily, drain select level support openings (not shown) may be formed over all, or a subset of, the support pillar structures 17. While an embodiment is described in which drain select level support openings are not formed, embodiments are expressly contemplated herein in which drain select level support openings are formed, and structures are subsequently formed in each combination of a drain select level support opening and an underlying support opening in the same manner as in each combination of a drain select level memory opening 149 and an underlying word line level memory opening 49.

Figure 15:
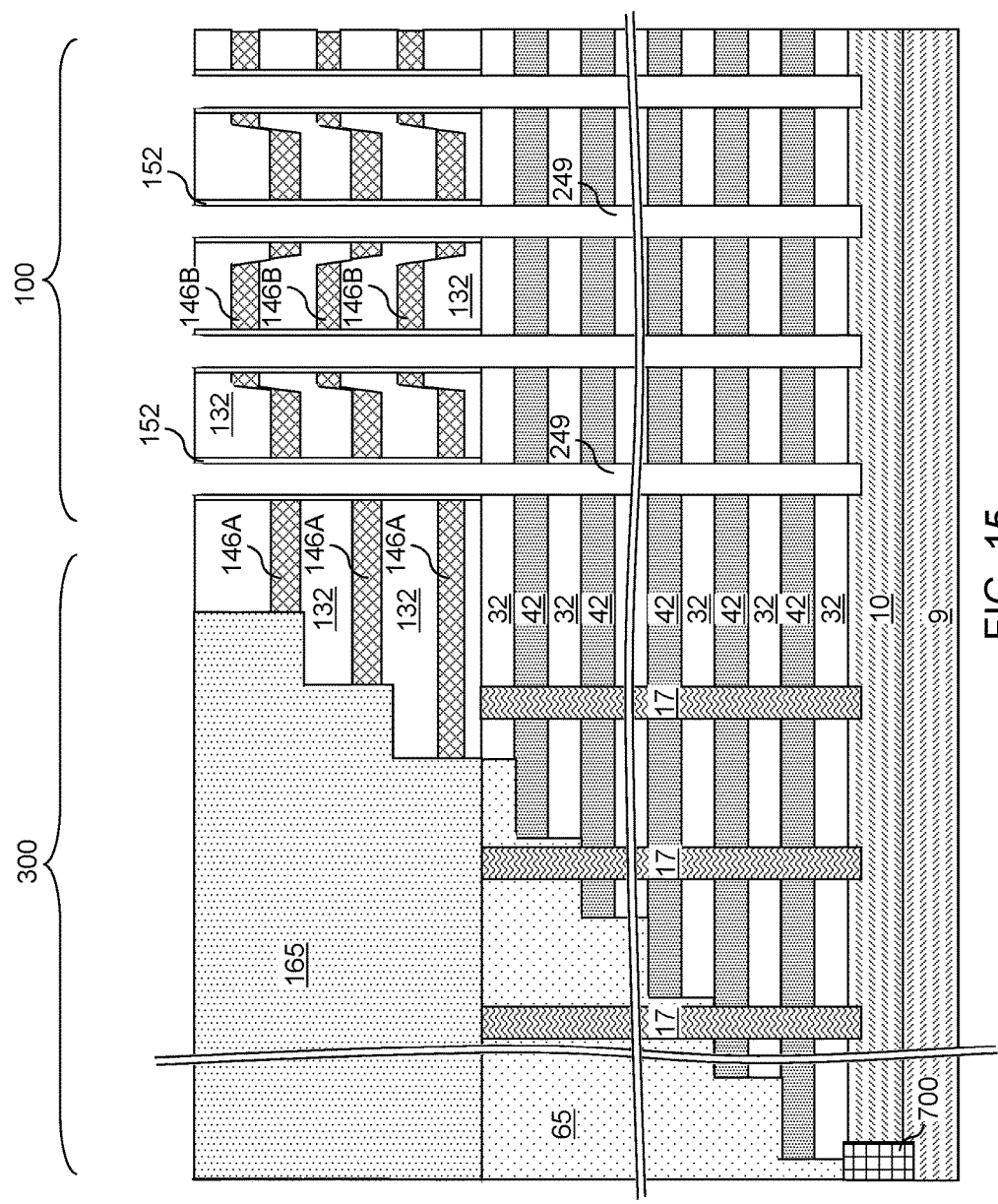
FIG. 15 is a schematic vertical cross-sectional view of the exemplary structure after forming drain select level dielectric liners and removal of the sacrificial memory opening fill structures according to an embodiment of the present disclosure.

Referring to FIG. 15, a dielectric material is conformally deposited in the drain select level memory openings 149, and is subsequently anisotropically etched to remove horizontal portions to form a drain select level dielectric liner 152 on the sidewalls but not the bottom surface of each of the drain select level memory opening 149. The dielectric material can include, for example, silicon oxide and/or a dielectric metal oxide (such as aluminum oxide). The thickness of the drain select level dielectric liners 152 can be in a range from 2 nm to 20 nm, although lesser and greater thicknesses can also be employed. Each drain select level dielectric liner 152 can have a cylindrical configuration.

An etch process can be performed to remove the material of the sacrificial memory opening fill structures 47. The etch process can be selective to the materials of the drain select level dielectric liners 152 and the alternating stack (32, 42). For example, if the sacrificial memory opening fill structures 47 include amorphous silicon or polysilicon, a wet etch employing a KOH solution can be employed to remove the sacrificial memory opening fill structures 47 selective to the materials of the drain select level dielectric liners 152 and the alternating stack (32, 42). In case thin sacrificial liners are present, the thin sacrificial liners can be subsequently removed by a selective etch. Removal of the sacrificial memory opening fill structures 47 in the word line level memory openings 49 from underneath the drain select level memory openings 149 forms memory openings 249. Each memory opening 249 includes a volume of a word line level memory opening 49 and a volume of a drain select level memory opening 149.

Figure 16:
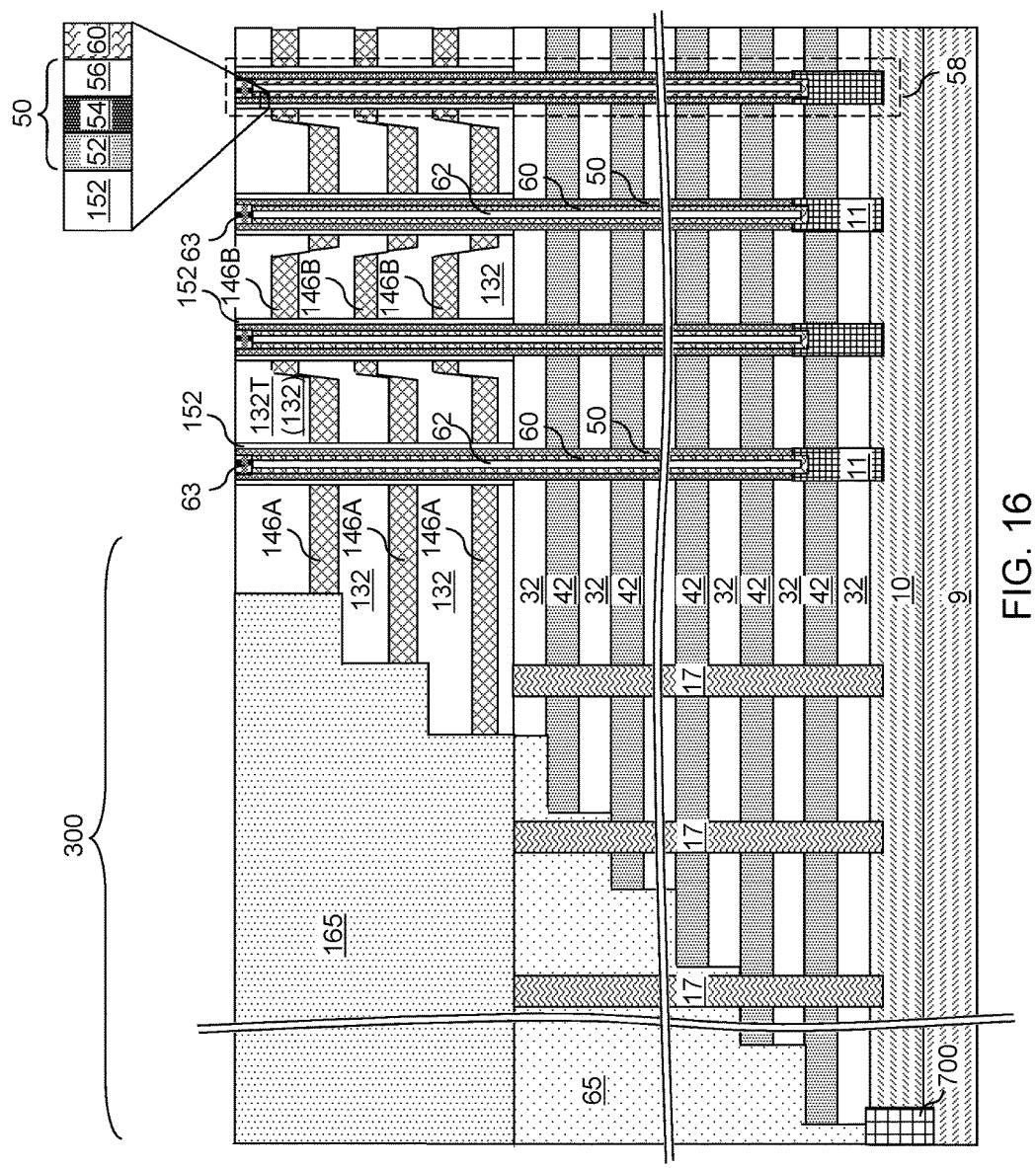
FIG. 16 is a schematic vertical cross-sectional view of the exemplary structure after formation of memory opening fill structures according to an embodiment of the present disclosure.

Referring to FIG. 16, memory opening fill structures 58 are formed in the memory openings 249. For example, an optional pedestal channel portion 11 can be formed at a bottom portion of each memory opening 249, for example, by selective epitaxy. The pedestal channel portion 11 can be a portion of a transistor channel that extends between a source region to be subsequently formed in the substrate (9, 10) and a drain region to be subsequently formed in an upper portion of the memory opening 249. A cavity is present in the unfilled portion of each memory opening 249 above the pedestal channel portion 11. If a semiconductor material layer 10 is not present, the pedestal channel portion 11 can be formed directly on the substrate semiconductor layer 9, which can have a doping of the first conductivity type.

A stack of layers including a blocking dielectric layer 52, a charge storage layer 54, a tunneling dielectric layer 56, and an optional semiconductor cover layer (not explicitly shown) can be sequentially deposited in the memory openings 249. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysicon or a metallic material that is patterned into multiple electrically isolated portions (e.g., floating gates), for example, by being formed within lateral recesses into stack level sacrificial material layers 42. In one embodiment, the charge storage layer 54 includes a silicon nitride layer. In one embodiment, the stack level sacrificial material layers 42 and the insulating layers 32 can have vertically coincident sidewalls, and the charge storage layer 54 can be formed as a single continuous layer.

In another embodiment, the stack level sacrificial material layers 42 can be laterally recessed with respect to the sidewalls of the insulating layers 32 prior to formation of the blocking dielectric layer 52, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional semiconductor cover layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor cover layer includes amorphous silicon or polysilicon. The semiconductor cover layer can be formed by a conformal deposition method such as low pressure chemical vapor deposition (LPCVD). The thickness of the semiconductor cover layer can be in a range from 2 nm to 10 nm, although lesser and greater thicknesses can also be employed. A cavity is present in the volume of each memory opening 249 that is not filled with the deposited material layers.

The optional semiconductor cover layer, the tunneling dielectric layer 56, the charge storage layer 54, the blocking dielectric layer 52 are sequentially anisotropically etched employing at least one anisotropic etch process. The portions of the semiconductor cover layer, the tunneling dielectric layer 56, the charge storage layer 54, and the blocking dielectric layer 52 located above the top surface of the topmost insulating spacer layer 132T can be removed by the at least one anisotropic etch process. Further, the horizontal portions of the semiconductor cover layer, the tunneling dielectric layer 56, the charge storage layer 54, and the blocking dielectric layer 52 at a bottom of each memory opening 249 can be removed to form openings in remaining portions thereof. Each combination of a blocking dielectric layer 52, a charge storage layer 54, and a tunneling dielectric layer 56 constitutes a memory film 50.

A surface of the pedestal channel portion 11 (or a surface of the semiconductor substrate layer 10 in case the pedestal channel portions 11 are not employed) can be physically exposed underneath the opening through the semiconductor cover layer, the tunneling dielectric layer 56, the charge storage layer 54, and the blocking dielectric layer 52. A doped semiconductor channel layer can be deposited directly on the semiconductor surface of the pedestal channel portion 11 (or the semiconductor substrate layer 10 if portion 11 is omitted), and directly on the semiconductor cover layer (if employed). The doped semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the doped semiconductor channel layer includes amorphous silicon or polysilicon. The doped semiconductor channel layer can be formed by a conformal deposition method such as low pressure chemical vapor deposition (LPCVD). The thickness of the doped semiconductor channel layer can be in a range from 2 nm to 10 nm, although lesser and greater thicknesses can also be employed. The materials of the semiconductor cover layer and the doped semiconductor channel layer are collectively referred to as a semiconductor channel material.

The horizontal portions of the doped semiconductor channel layer located above the top surface of the topmost insulating spacer layer 132T can be removed by a planarization process, which can employ a recess etch or chemical mechanical planarization (CMP). Each remaining portion of the doped semiconductor channel layer and the semiconductor cover layer within a memory opening 249 constitutes a vertical semiconductor channel 60. In case the memory openings 249 are not completely filled with the vertical semiconductor channel, a dielectric core 62 can be formed within unfilled volumes of the memory openings 249 by deposition and recess of a dielectric material such as silicon oxide. A top portion of the dielectric core 62 can be recessed below a horizontal plane including the top surface of the topmost insulating spacer layer 132T, and can be filled with a doped semiconductor material having a doping of the first conductivity type to form a drain region 63 at an upper portion of each memory openings 249.

Each combination of a memory film 50 and a vertical semiconductor channel 60 in a same memory opening 249 constitutes a memory stack structure that includes a vertical stack of memory elements located at each level of the stack level sacrificial material layers 42. Each combination of an optional pedestal channel portion 11, a memory film 50, a vertical semiconductor channel 60, an optional dielectric core 62, and a drain region 63 constitutes a memory opening fill structure 58. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

The processing steps of FIG. 16 form memory stack structures (50, 60) through the first and second drain select level electrically conductive layers (146A, 146B) and through the alternating stack (32, 42). Each of the memory stack structures (50, 60) is formed through a subset of the first drain select level electrically conductive layers 146A but not through the second drain select level electrically conductive layers 146B, or through a subset of the second drain select level electrically conductive layers 146B but not through the first drain select level electrically conductive layers 146A, depending on the location of the respective memory stack structure (50, 60). In one embodiment, a first set of memory stack structures (50, 60) directly contacts the first drain select level electrically conductive layers 146A and does not directly contact the second drain select level electrically conductive layers 146B; and a second set of memory stack structure (50, 60) directly contacts the second drain select level electrically conductive layers 146B and does not directly contact the first drain select level electrically conductive layers 146A.

Figure 17A:
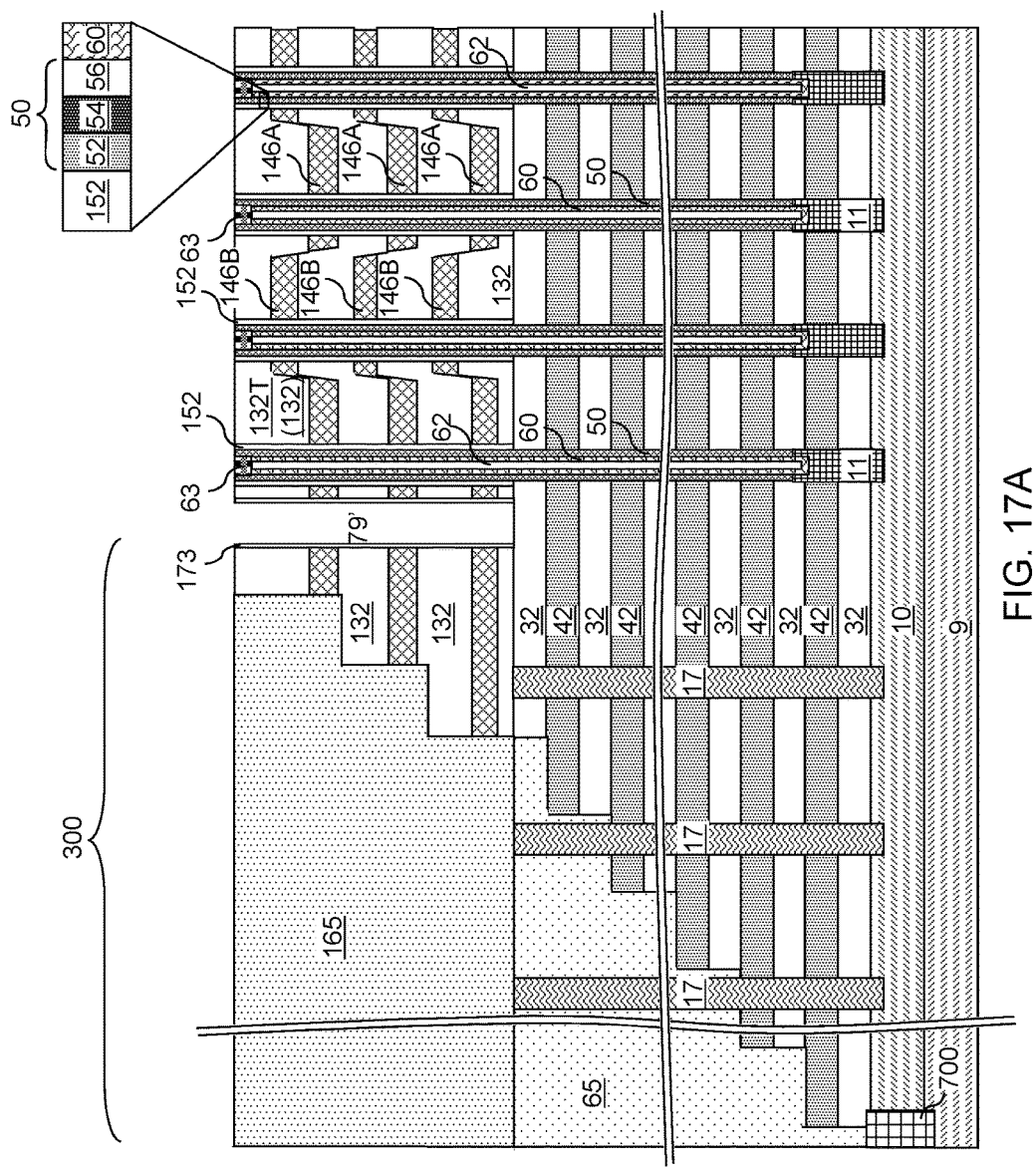
FIG. 17A is a schematic vertical cross-sectional view of the exemplary structure after formation of upper backside trenches and upper backside trench liners according to an embodiment of the present disclosure.
Figure 17B:
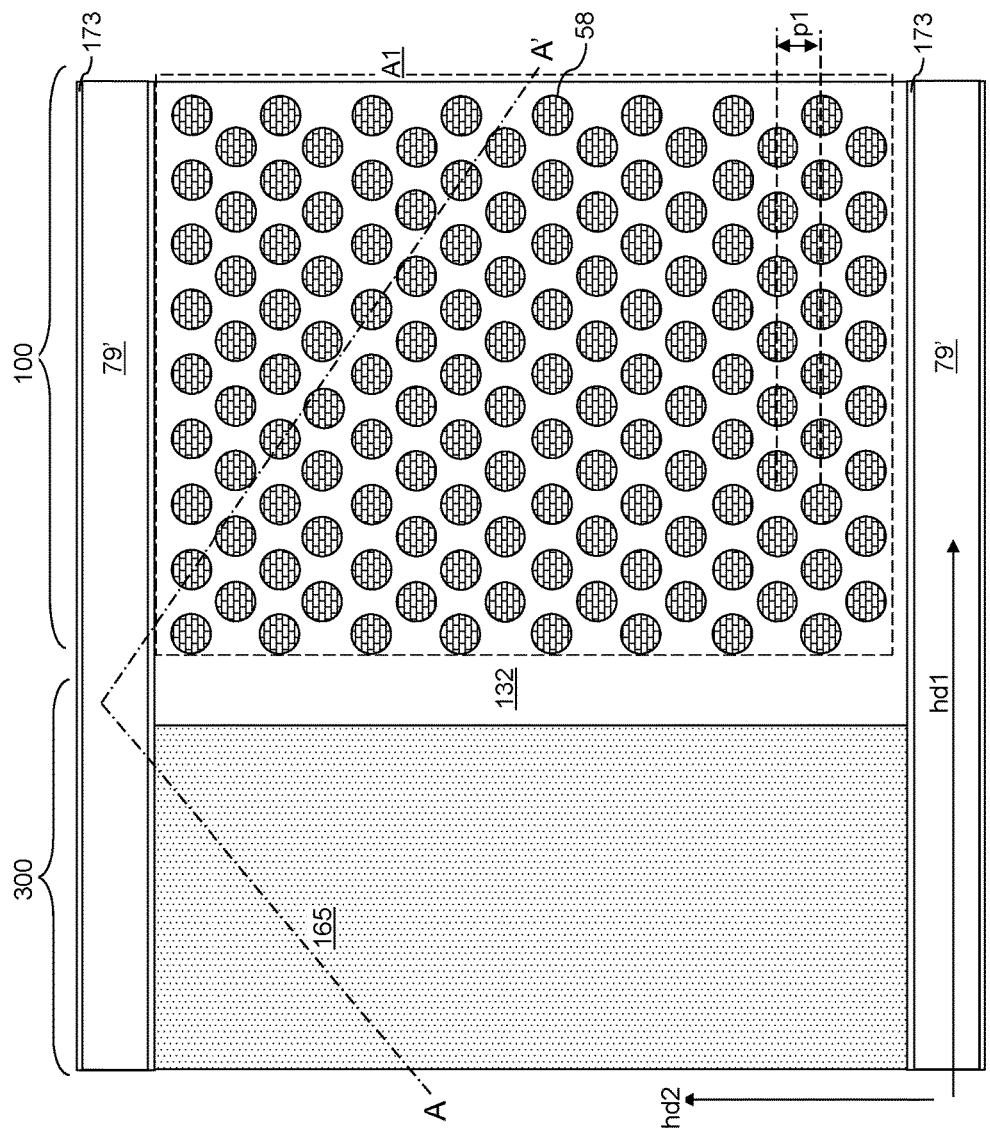
FIG. 17B is a top-down view of the exemplary structure of FIG. 17A. The zig-zag vertical plane A-A' is the plane of the schematic vertical cross-sectional view of FIG. 17A.

Referring to FIGS. 17A and 17B, a photoresist layer (not shown) can be applied over the exemplary structure, and can be lithographically patterned to form openings in areas between clusters of memory stack structures (50, 60), i.e., between neighboring arrays of memory stack structures (50, 60). The pattern in the photoresist layer can be transferred through the insulating spacer layers 132, the drain select level electrically conductive layers (146A, 146B), and the drain select level retro-stepped dielectric material portion 165 employing an anisotropic etch. Upper backside trenches are formed, which vertically extend to a top surface of the topmost layer of the alternating stack (32, 42). Sidewalls of the drain select level electrically conductive layers (146A, 146B) can be physically exposed. The photoresist layer can be removed, for example, by ashing.

A sacrificial dielectric material can be deposited as a conformal material layer in the upper backside trenches, and can be anisotropically etched to remove horizontal portions to form upper backside trench liners 173 on sidewalls but not bottom surfaces of the backside trenches. The upper backside trench liners 173 can include a dielectric material such as silicon nitride or silicon oxide, and can have a thickness in a range from 3 nm to 30 nm. The upper backside trench liners 173 prevent or reduce re-sputtering of the conductive material (e.g., tungsten) of the drain select level electrically conductive layers (146A, 146B) on sidewalls of lower backside trenches to be subsequently formed underneath the upper backside trenches, which makes sidewall etching more even. An upper backside cavity 79' is present within each volume of an upper backside trench that is not filled with an upper backside trench liner 173.

Figure 18:
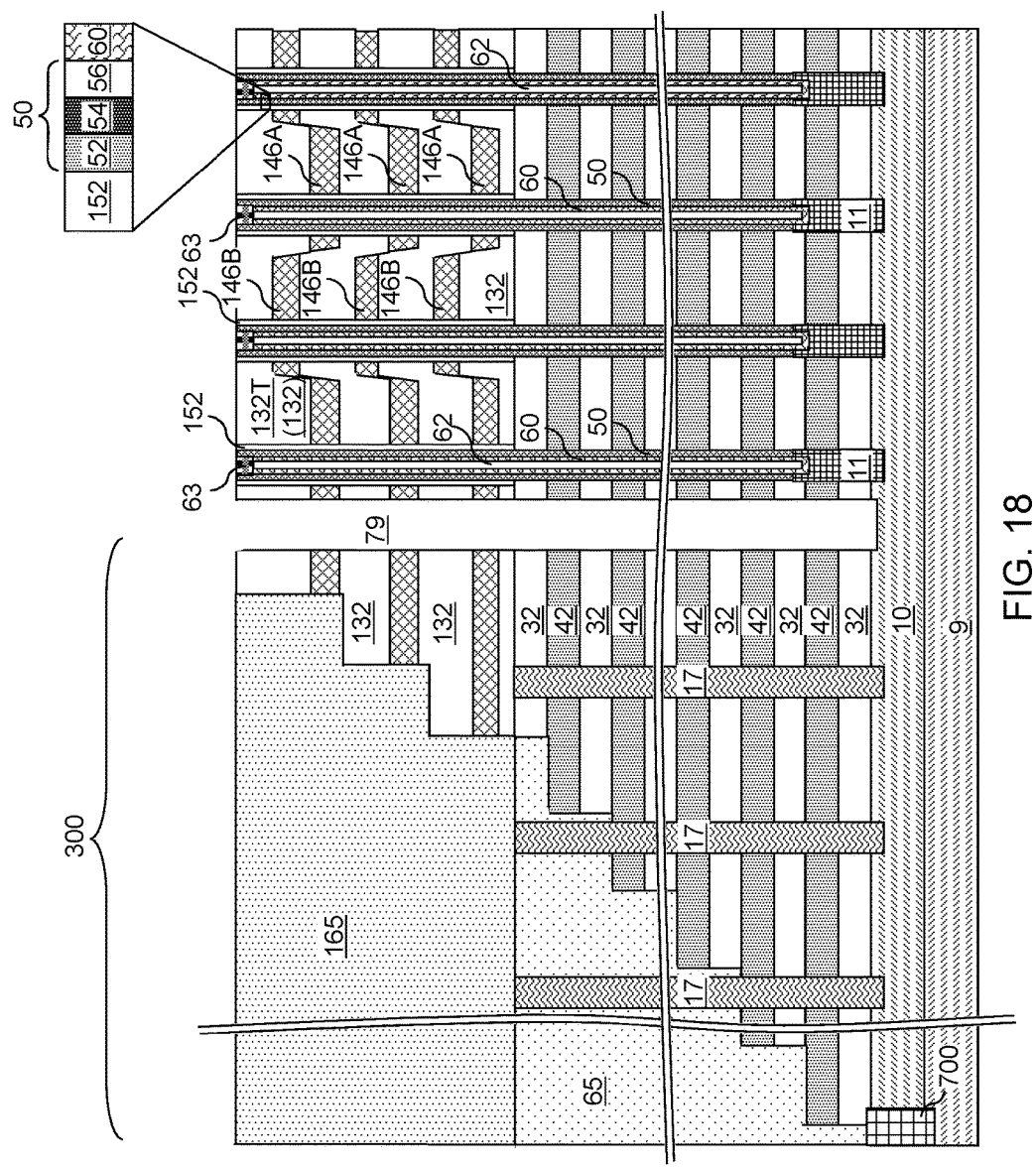
FIG. 18 is a schematic vertical cross-sectional view of the exemplary structure after extension of the upper backside trenches into backside trenches and removal of the upper backside trench liners according to an embodiment of the present disclosure.

Referring to FIG. 18, another photoresist layer can be applied over the topmost insulating spacer layer 132T, and can be lithographically patterned to form openings that overlie the upper backside cavities 79'. An anisotropic etch process can be performed to vertically extend each upper backside cavity 79' through the alternating stack (32, 42), thereby forming backside trenches 79. A top surface of the semiconductor material layer 10 can be physically exposed at the bottom of each backside trench 79. The photoresist layer can be removed, for example, by ashing. The upper backside trench liners 173 can be removed at this processing step, or at a subsequent processing step. Alternatively, the upper backside trench liners 173 may remain on the sidewalls of the drain select level electrically conductive layers (146A, 146B) and the insulating spacer layers 132.

In one embodiment, the backside trenches 79 can include a source contact opening in which a source conductive via structure (e.g., source contact via structure) can be subsequently formed. In one embodiment, the backside trenches 79 can laterally extend along the first horizontal direction hd1 (which can be the word line direction), and can be laterally spaced among one another along the second horizontal direction hd2 (which can be the bit line direction).

In case the stack level spacer material layers are formed as stack level sacrificial material layers 42, the stack level spacer material layers can be subsequently replaced with stack level electrically conductive layers.

Figure 19:
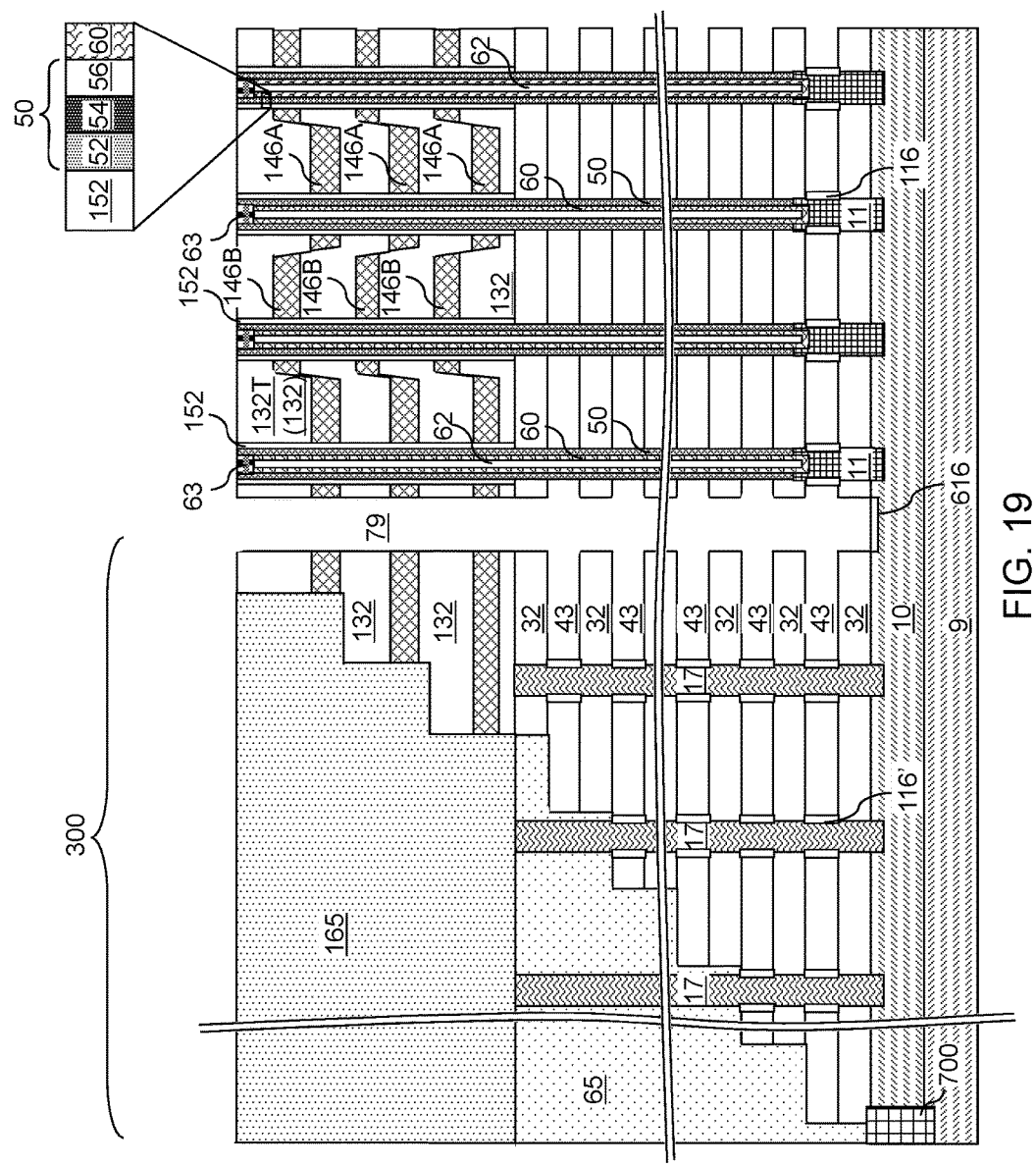
FIG. 19 is a schematic vertical cross-sectional view of the exemplary structure after formation of backside recesses according to an embodiment of the present disclosure.

Referring to FIG. 19, an etchant that selectively etches the second material of the stack level sacrificial material layers 42 with respect to the first material of the insulating layers 32 can be introduced into the backside trenches 79, for example, employing an etch process. Backside recesses 43 are formed in volumes from which the stack level sacrificial material layers 42 are removed. The removal of the second material of the stack level sacrificial material layers 42 can be selective to the first material of the insulating layers 32, the material of the retro-stepped dielectric material portion 65, the material of the support pillar structures 17, the semiconductor material of the semiconductor material layer 10, and the material of the outermost layer of the memory films 50. In one embodiment, the stack level sacrificial material layers 42 can include silicon nitride, and the materials of the insulating layers 32 and the retro-stepped dielectric material portion 65 can be selected from silicon oxide and dielectric metal oxides, and the support pillar structures 17 can include polysilicon or amorphous silicon.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the stack level sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures (50, 60) provide structural support while the backside recesses 43 are present within volumes previously occupied by the stack level sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the stack level sacrificial material layers 42 is removed. The memory openings in which the memory stack structures (50, 60) are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11, the semiconductor material layer 10, and the support pillar structures 17 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, to convert each physically exposed surface portion of the semiconductor material layer 10 into a planar dielectric portion 616, and to convert physically exposed surface portions of the support pillar structures 17 into support dielectric spacers 116'. In one embodiment, each tubular dielectric spacer 116 and each support dielectric spacers 116' can be topologically homeomorphic to a torus, i.e., generally ring-shaped. As used herein, an element is topologically homeomorphic to a torus if the shape of the element can be continuously stretched without destroying a hole or forming a new hole into the shape of a torus.

The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Each support dielectric spacer 116' can include a dielectric material that includes the same semiconductor element as the support pillar structures 17 and additionally includes at least one non-metallic element such as oxygen and/or nitrogen.

Figure 20:
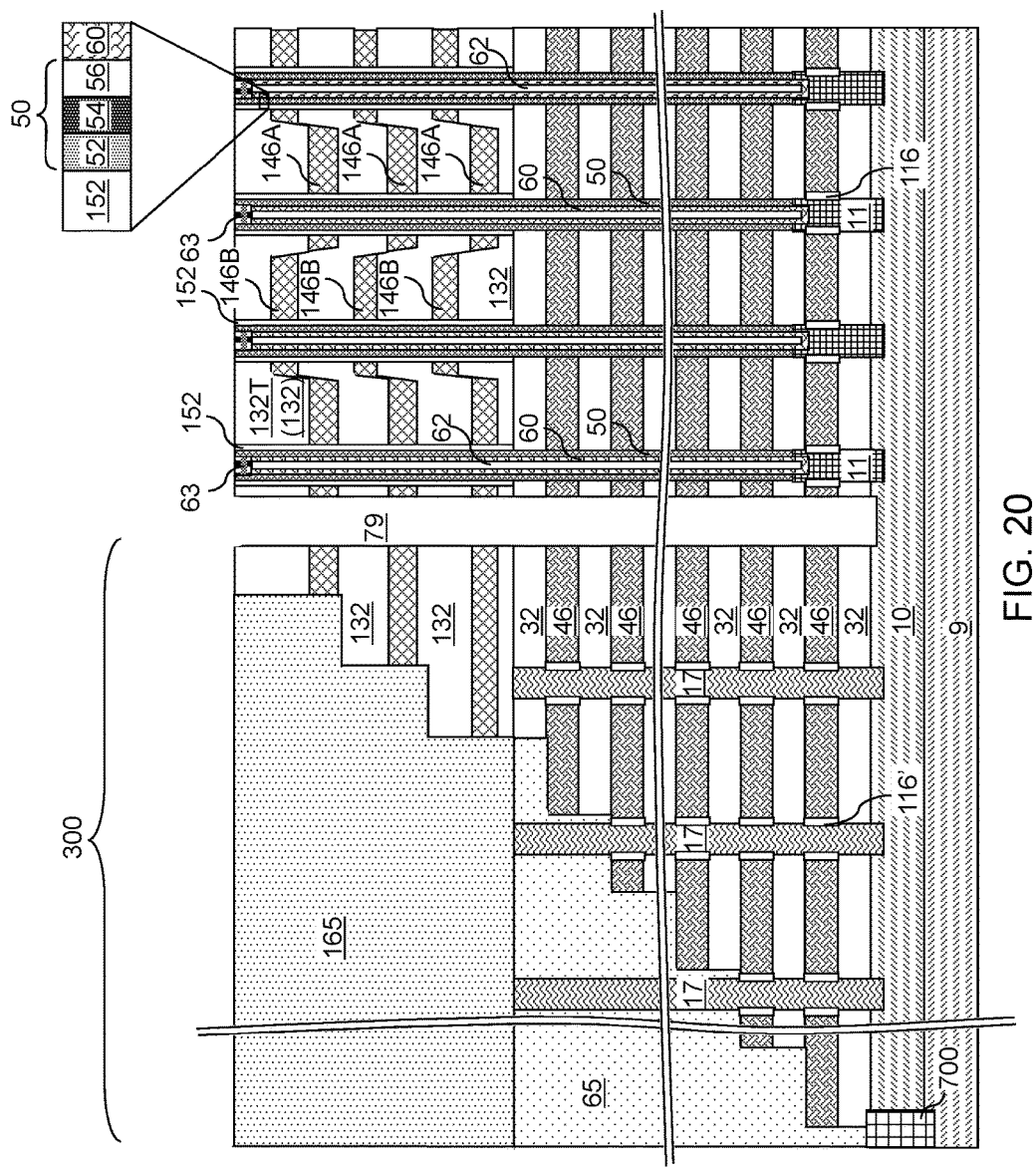
FIG. 20 is a schematic vertical cross-sectional view of the exemplary structure after formation of stack level electrically conductive layers according to an embodiment of the present disclosure.

Referring to FIG. 20, a backside blocking dielectric layer (not shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. In one embodiment, the backside blocking dielectric layer can be formed by a conformal deposition process such as atomic layer deposition (ALD). The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

At least one conductive material can be subsequently deposited in the backside recesses 43. The at least one conductive material can include, for example, a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the backside trench 79, and over the top surface of the topmost insulating layer 32 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer 46B can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures (50, 60) by the metallic barrier layer, which is a metallic barrier layer that blocks diffusion of fluorine atoms therethrough.

A plurality of stack level electrically conductive layers 46 can be formed in the plurality of backside recesses 43, and a continuous metallic material layer (not shown) can be formed on the sidewalls of each backside trench 79 and over the topmost insulating spacer layer 132T. Each stack level electrically conductive layer 46 includes a portion of the metallic barrier layer and a portion of the metallic fill material layer that are located between a vertically neighboring pair of dielectric material layers, which can be a pair of insulating layers 32. The continuous metallic material layer includes a continuous portion of the metallic barrier layer and a continuous portion of the metallic fill material layer that are located in the backside trenches 79 or above the topmost insulating spacer layer 132.

Each stack level sacrificial material layer 42 can be replaced with a stack level electrically conductive layer 46. A backside cavity 79 is present in the portion of each backside trench 79 that is not filled with the backside blocking dielectric layer and the continuous metallic material layer. A tubular dielectric spacer 116 laterally surrounds a pedestal channel portion 11. A bottommost stack level electrically conductive layer 46 laterally surrounds each tubular dielectric spacer 116 upon formation of the stack level electrically conductive layers 46.

The deposited metallic material of the continuous electrically conductive material layer is etched back from the sidewalls of each backside trench 79 and from above the topmost insulating spacer layer 132T, for example, by an isotropic wet etch, an anisotropic dry etch, or a combination thereof. The horizontal portions of the backside blocking dielectric layer and the planar dielectric portions 616 can be removed from inside the backside trenches 79 by the etch process. Each remaining portion of the deposited metallic material in the backside recesses 43 constitutes a stack level electrically conductive layer 46. Each stack level electrically conductive layer 46 can be a conductive line structure. Thus, the stack level sacrificial material layers 42 are replaced with the stack level electrically conductive layers 46.

Each stack level electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each stack level electrically conductive layer 46 are the control gate electrodes for the vertical memory devices including the memory stack structures (50, 60). In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer. In this case, a horizontal portion of the backside blocking dielectric layer can be present at the bottom of each backside trench 79. A backside cavity is present within each backside trench 79.

Figure 21A:
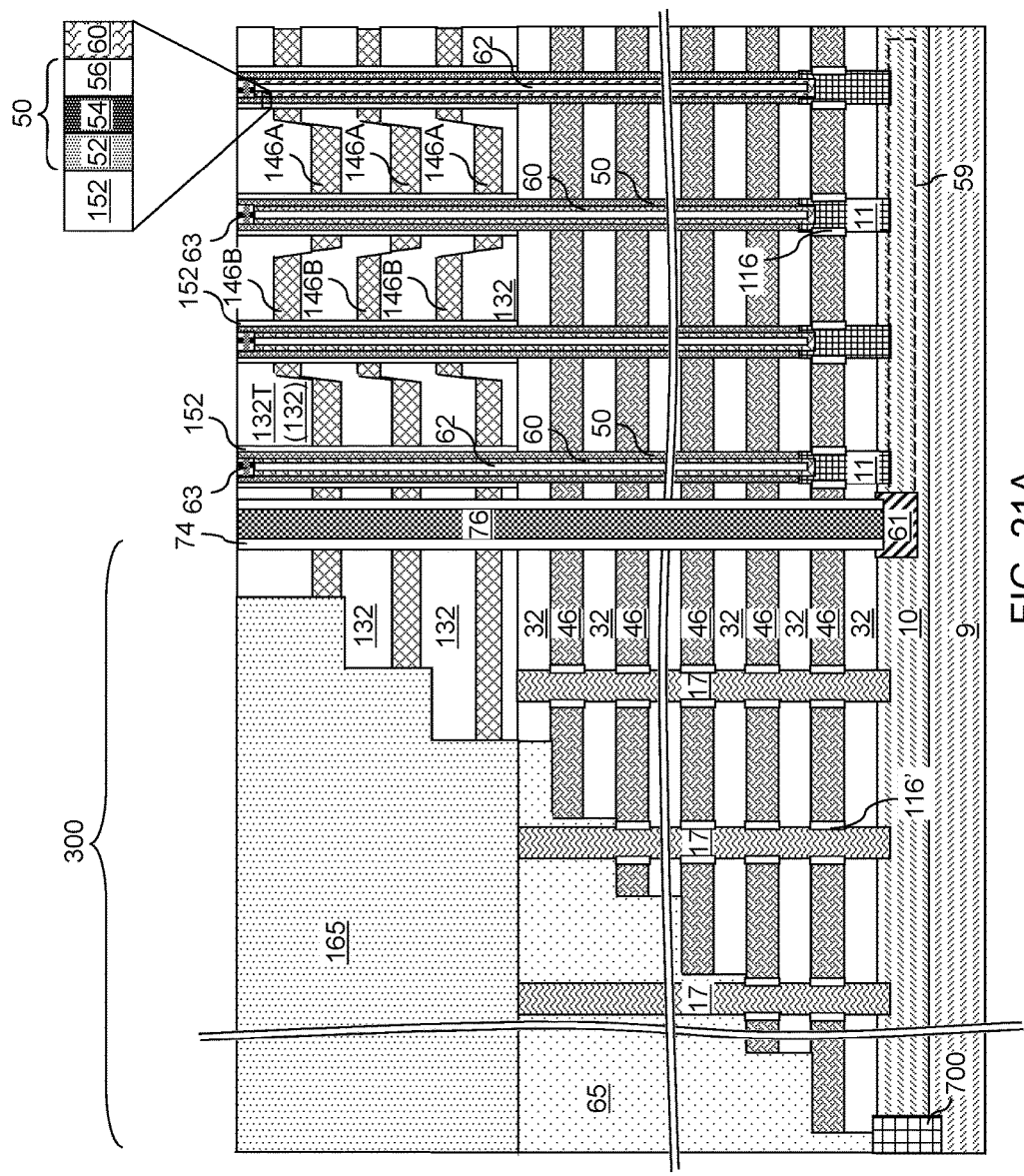
FIG. 21A is a schematic vertical cross-sectional view of the exemplary structure after formation of source regions, insulating spacers, and backside contact via structures according to an embodiment of the present disclosure.
Figure 21B:
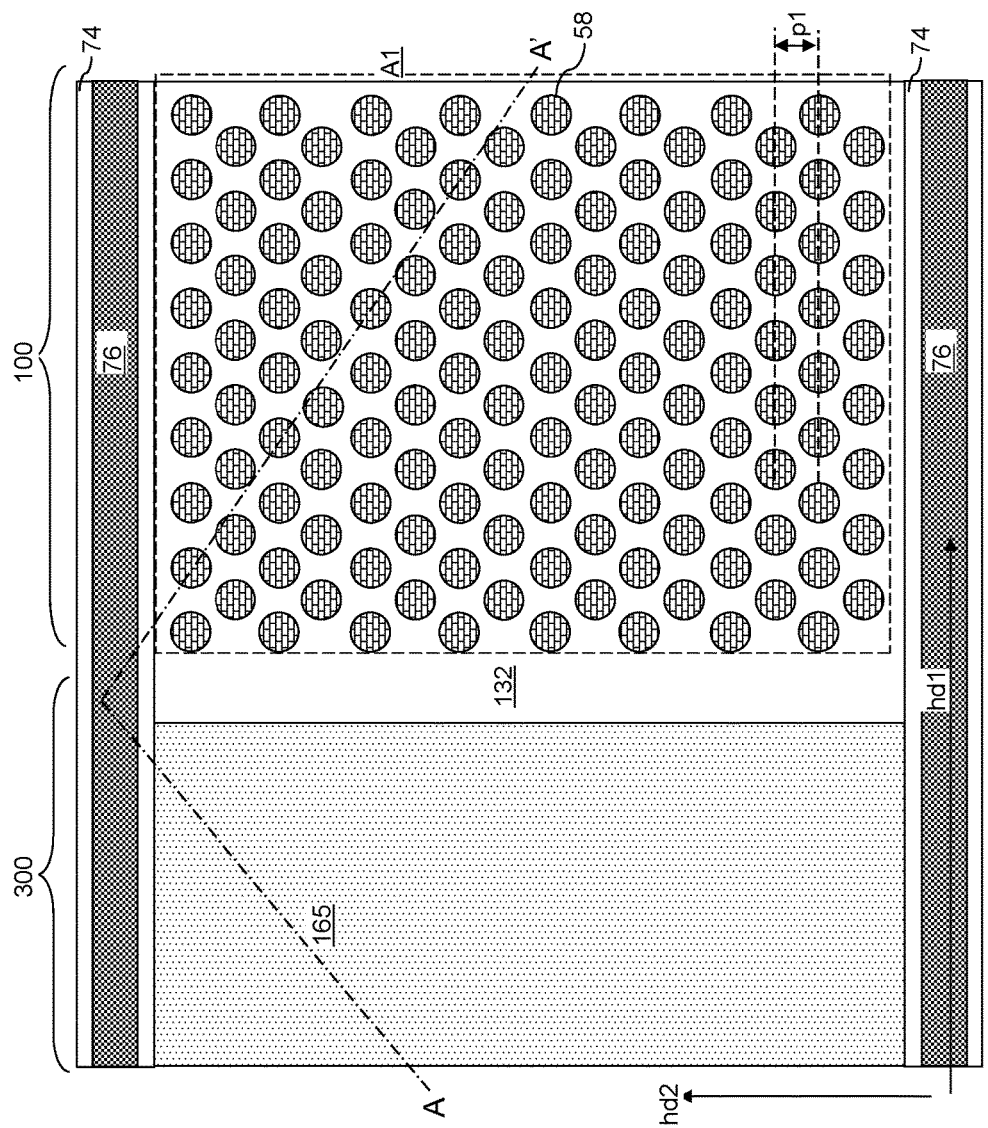
FIG. 21B is a top-down view of the exemplary structure of FIG. 21A. The zig-zag vertical plane A-A' is the plane of the schematic vertical cross-sectional view of FIG. 21A.

Referring to FIGS. 21A and 21B, an insulating material layer can be formed in the backside trenches 79 and over the topmost insulating spacer layer 132T by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the topmost insulating cap layer 132T and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79. In one embodiment, each of the pair of dielectric material portions (such as insulating spacers 74) directly contact a subset of the first drain select level electrically conductive layers 146A but not the second drain select level electrically conductive layers 146B, or a subset of the second drain level electrically conductive layers 146B but not the first drain select level electrically conductive layers 146A.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10).

A backside conductive via structure 76 can be formed within each backside cavity surrounded by a respective insulating spacer 74. Each backside conductive via structures 76 can be formed by depositing at least one conductive material in the remaining unfilled volume of the backside trenches 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be removed from above the topmost insulating spacer layer 132T. If chemical mechanical planarization (CMP) process is employed, the topmost insulating spacer layer 132T can be employed as a CMP stopping layer. Each remaining continuous portion of the at least one conductive material in the backside trenches 79 constitutes a backside conductive via structure 76. The backside conductive via structures 76 extend through the alternating stack (32, 46), the drain select level electrically conductive layers (146A, 146B), the insulating spacer layers 132, and contacts a top surface of a respective source region 61.

While the present disclosure is described employing an embodiment in which an insulating spacer 74 is formed as a dielectric material portion in each backside trench, embodiments are expressly contemplated herein in which the backside trenches 79 are completely filled with dielectric material portions. In this case, source regions 61 can be formed in portions of the semiconductor material layer 10 in the contact region 300 underneath respective trenches that extend through the drain select level retro-stepped dielectric material portion 165 and the retro-stepped dielectric material portion 65.

Figure 22A:
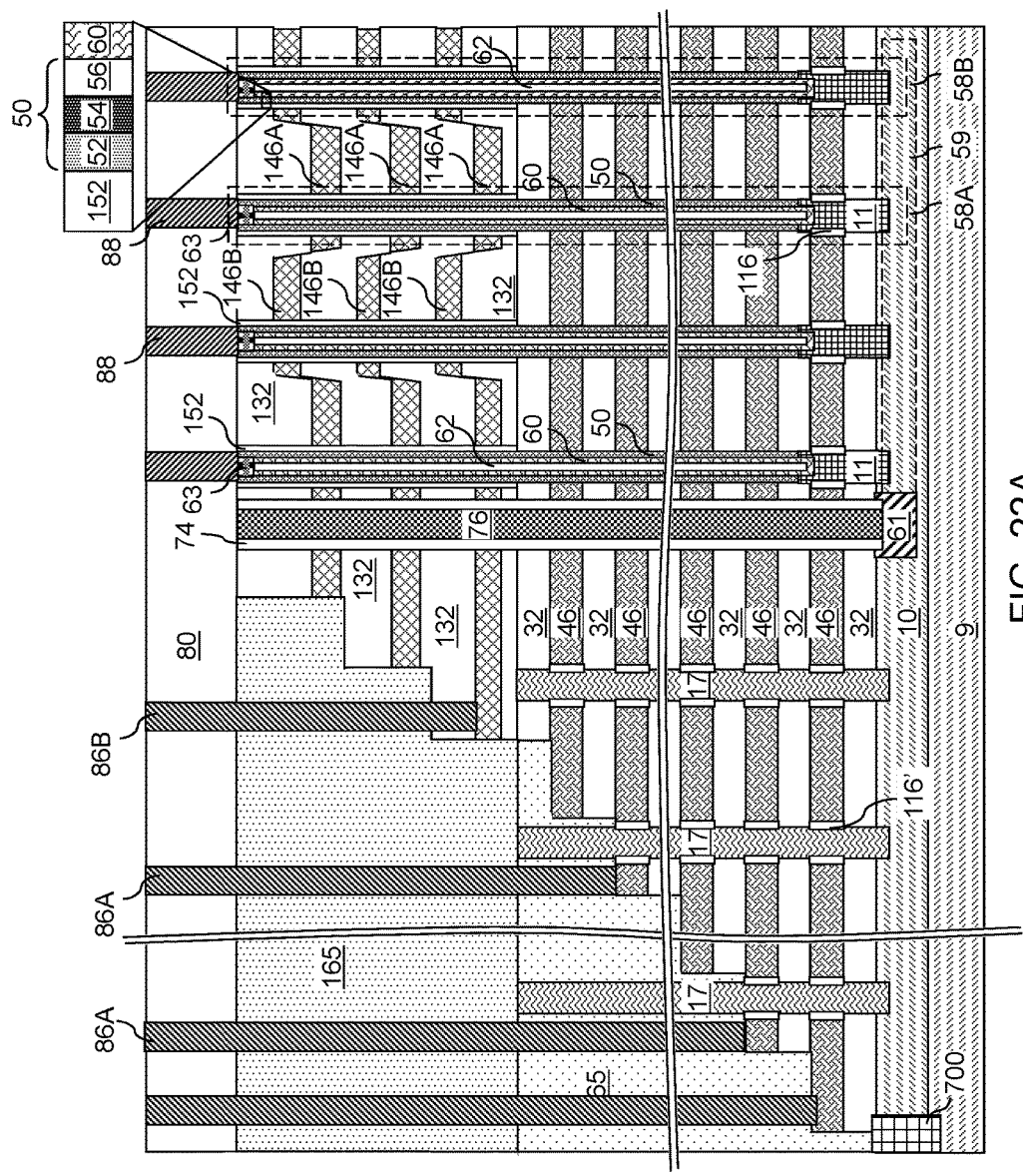
FIG. 22A is a schematic vertical cross-sectional view of the exemplary structure after formation of various conductive via structures according to an embodiment of the present disclosure.
Figure 22B:
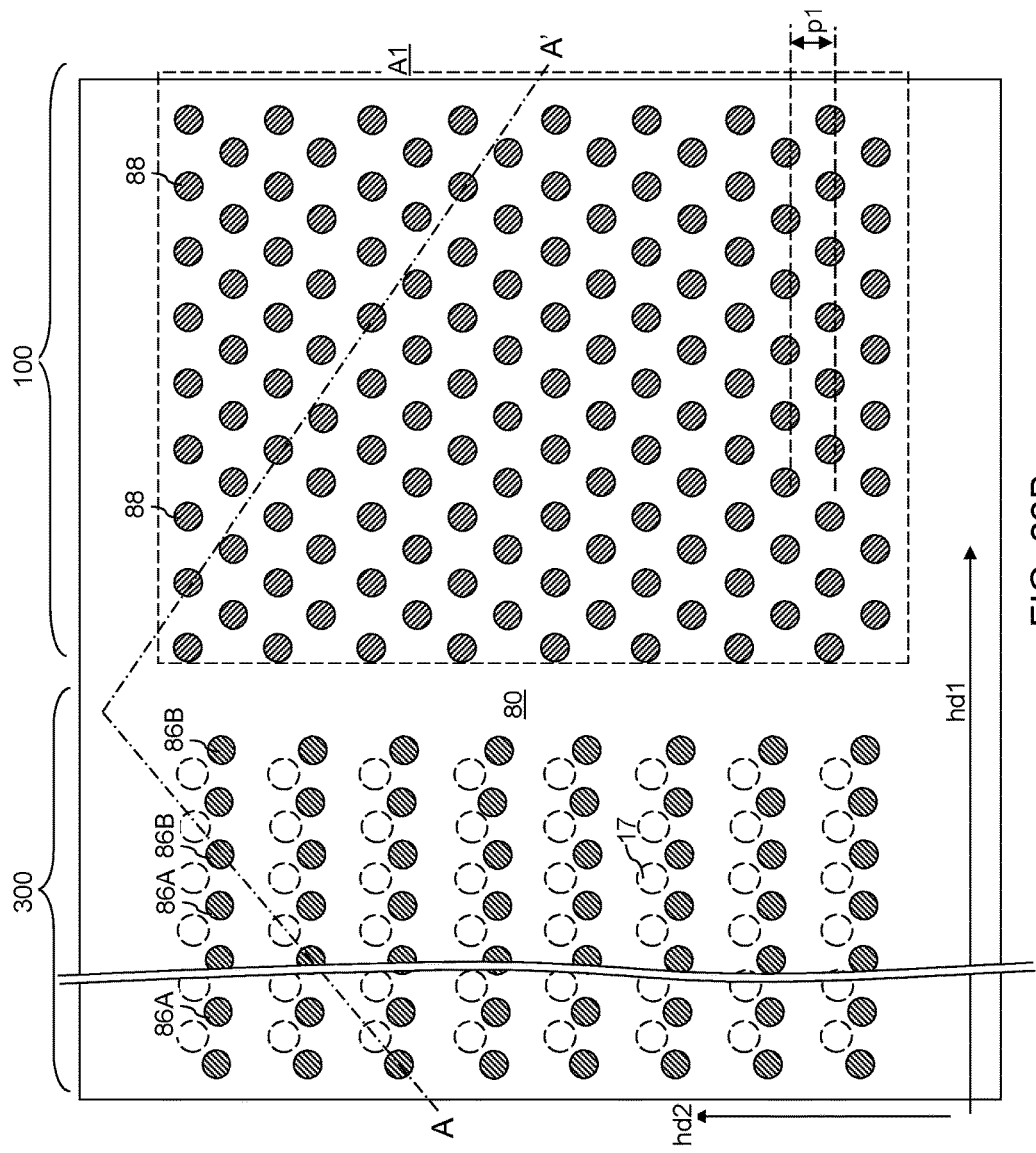
FIG. 22B is a top-down view of the exemplary structure of FIG. 22A. The vertical plane A-A' is the plane of the schematic vertical cross-sectional view of FIG. 22A.

Referring to FIGS. 22A and 22B, a contact level dielectric material layer 80 can be deposited over the drain select level layers (132, 146A, 146B). The contact level dielectric material layer 80 includes a dielectric material such as silicon oxide. The contact level dielectric material layer 80 can be deposited by a conformal deposition method or by a non-conformal deposition method. The thickness of the contact level dielectric material layer 80 can be in a range from 50 nm to 500 nm, although lesser and greater thicknesses can also be employed.

Contact via cavities can be formed through the contact level dielectric material layer 80 and optionally through the drain select level retro-stepped dielectric material portion 165 and the retro-stepped dielectric material portion 65. For example, a photoresist layer (not shown) can be applied and patterned over the contact level dielectric material layer 80 to form openings therein, and the pattern of the openings in the photoresist layer can be transferred through the contact level dielectric material layer 80, the drain select level retro-stepped dielectric material portion 165, and the retro-stepped dielectric material portion 65 to form various contact via cavities. At least one conductive material can be deposited in the contact via cavities to form conductive via structures, which include drain contact via structures 88 that contact a respective drain region 63 and control gate contact via structures 86A (which are also referred to as word line contact via structures) that contact a respective one of the stack level electrically conductive layers 46, and drain select level contact via structures 86B that contact a respective one of the drain select level electrically conductive layers (146A, 146B).

The exemplary structure of the present disclosure can include a three-dimensional memory device. The three-dimensional memory device can include: an alternating stack of insulating layers 32 and stack level electrically conductive layers 46 located over a top surface of a substrate (9, 10); first drain select level electrically conductive layers 146A and second drain select level electrically conductive layers 146B that are vertically offset located over the alternating stack (32, 46), wherein the second drain select level electrically conductive layers 146B are vertically offset from the first drain select level electrically conductive layers 146A and are located in areas that do not overlap with the first drain select level electrically conductive layers 146A in a plan view along a direction perpendicular to the top surface of the substrate (9, 10); a first set of memory stack structures (50, 60) extending through the alternating stack (32, 46) and the first drain select level electrically conductive layers 146A; and a second set of memory stack structure (50, 60) extending through the alternating stack (32, 46) and the second set of electrically conductive layers 146B.

In one embodiment, each of the first and second drain select level electrically conductive layers (146A, 146B) has a pair of tapered sidewalls that extend along a first horizontal direction hd1. In one embodiment, each of the first drain select level electrically conductive layers 146A has a top surface that is wider than a bottom surface thereof, and each of the second drain select level electrically conductive layers 146B has a top surface that is narrower than a bottom surface thereof. In one embodiment, each of the first drain select level electrically conductive layers 146A has an inverse trapezoidal vertical cross-sectional shape within a vertical plane perpendicular to the first horizontal direction hd1, and each of the second drain select level electrically conductive layers 146B has a trapezoidal vertical cross-sectional shape within the vertical plane perpendicular to the first horizontal direction hd1.

In one embodiment, levels of the first drain select level electrically conductive layers 146A are interlaced with levels of the second drain select level electrically conductive layers 146B. The first drain select level electrically conductive layers 146A are arranged as first multiple strips that are laterally spaced apart within each level in the first set of multiple levels, and the second drain select level electrically conductive layers 146B are arranged as second multiple strips that are laterally spaced part within each level in the second set of multiple levels. The three-dimensional memory device can further include a pair of backside trenches 79 extending through the alternating stack (32, 46) and levels of the first and second drain select level electrically conductive layers (146A, 146B); and a pair of dielectric material portions located in the pair of backside trenches 79, which can be the insulating spacers 74. In one embodiment, each of the pair of dielectric material portions (such as insulating spacers 74) directly contact a subset of the first drain select level electrically conductive layers 146A but not the second drain select level electrically conductive layers 146B, or a subset of the second drain level electrically conductive layers 146B but not the first drain select level electrically conductive layers 146A.

In one embodiment, the first set of memory stack structures (50, 60) directly contacts the first drain select level electrically conductive layers 146A and does not directly contact the second drain select level electrically conductive layers 146B; and the second set of memory stack structure (50, 60) directly contacts the second drain select level electrically conductive layers 146A and does not directly contact the first drain select level electrically conductive layers 146B. Each memory stack structure (50, 60) of the first and the second sets of memory stack structure comprises a vertical channel 60 and a memory film 50, and the stack level electrically conductive layers 46 comprise horizontal word lines. Each word line 46 contacts the first and the second set of memory stack structures (50, 60) and does not have vertically offset portions. The drain select level electrically conductive layers (146A, 146B) comprise drain side select gate electrodes of drain side select transistors of vertical NAND strings (e.g., memory opening fill structures 58)

Insulating spacer layers 132 can be located between each vertically neighboring pair of first drain select level electrically conductive layers 146A and between each vertically neighboring pair of second drain select level electrically conductive layers 146B. Each bottommost second drain select level electrically conductive layer 146B can be located above a first horizontal plane including top surfaces of bottommost first drain select level electrically conductive layers 146A and below a topmost surface of an insulating spacer layer 132 that contacts the bottommost first drain select level electrically conductive layers 146A.

In one embodiment, a bottommost insulating spacer layer 132B among the insulating spacer layers 132 has a planar bottom surface that contacts a planar top surface of a topmost insulating layer 32 among the insulating layers 32 of the alternating stack (32, 46). Vertically protruding portions of the bottommost insulating spacer layer 132B among the insulating spacer layers contact a respective one of the second drain select level electrically conductive layers 146A, and recessed portions of the bottommost insulating spacer layer 132B among the insulating spacer layers 132 contact a respective one of the first drain select level electrically conductive layers 146A.

In one embodiment, the alternating stack (32, 46) comprises a terrace region in which each stack level electrically conductive layer 46 other than a topmost stack level electrically conductive layer 46 within the alternating stack (32, 46) laterally extends farther than any overlying stack level electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and the support pillar structures 17 extend through the stepped surfaces and through a retro-stepped dielectric material portion 65 that overlies the stepped surfaces.

In one embodiment, the three-dimensional memory device comprises a vertical NAND memory device. Some of the stack level electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings 58 over the silicon substrate. At least one memory cell (as embodied as a portion of a charge storage layer 54 at a level of a stack level electrically conductive layer 46) in a first device level of the array of monolithic three-dimensional NAND strings can be located over another memory cell (as embodied as another portion of the charge storage layer 54 at a level of another stack level electrically conductive layer 46) in a second device level of the array of monolithic three-dimensional NAND strings. The silicon substrate can contain an integrated circuit comprising a driver circuit for the memory device located thereon. The stack level electrically conductive layers 46 can comprise a plurality of control gate electrodes having a strip shape extending substantially parallel to the top surface of the substrate (9, 10), e.g., between a pair of backside trenches. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Referring to FIG. 22A, in one embodiment, a monolithic three-dimensional NAND memory device comprises an alternating stack (32, 46) of insulating layers 32 and word lines 46 located over a top surface of a substrate (9, 10), a first vertical NAND string 58A which extends through the alternating stack and contacts all word lines 46 in the alternating stack, and a second vertical NAND string 58B which extends through the alternating stack and contacts all word lines 46 in the alternating stack. A first drain select gate electrode 146A contacts the first vertical NAND string 58A but not the second vertical NAND string 58B. A second drain select gate electrode 146B contacts the second vertical NAND string 58B but not the first vertical NAND string 58A. The second drain select gate electrode 146B is vertically offset from the first drain select gate electrode 146A in the direction perpendicular to the top surface of the substrate (9, 10). The first drain select gate electrode 146A is the bottommost drain select gate electrode that contacts the first vertical NAND string 58A. The second drain select gate electrode 146B is the bottommost drain select gate electrode that contacts the second vertical NAND string 58B.

The three-dimensional memory device of the present disclosure minimizes lateral spacing between laterally neighboring drain select level electrically conductive layers (146A, 146B) by vertically offsetting neighboring pairs of drain select level electrically conductive layers (146A, 146B). For example, sets of first drain select level electrically conductive layers 146A may be provided only at odd-numbered levels (as counted from the bottom) for the drain select level electrically conductive layers (146A, 146B), and sets of second drain select level electrically conductive layers 146B may be provided only at even-numbered levels for the drain select level electrically conductive layers (146A, 146B). The three-dimensional memory device of the present disclosure can be employed to facilitate scaling into smaller devices with high areal efficiency. Thus, shallow trenches filled with insulating material which extend only through the drain select gate level(s) can be omitted to increase device density.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and stack level electrically conductive layers located over a top surface of a substrate;
initial first drain select level electrically conductive layers and initial second drain select level electrically conductive layers that are vertically offset and located over the alternating stack, wherein the initial second drain select level electrically conductive layers are vertically offset from the initial first drain select level electrically conductive layers and are located in areas that do not overlap with the initial first drain select level electrically conductive layers in a plan view along a direction perpendicular to the top surface of the substrate;

a first set of memory stack structures extending through the alternating stack and the initial first drain select level electrically conductive layers;

a second set of memory stack structure extending through the alternating stack and the initial second set of electrically conductive layers;

a pair of backside trenches extending through the alternating stack and levels of the initial first and second drain select level electrically conductive layers; and a pair of dielectric material portions located in the pair of backside trenches, wherein:
each of the pair of dielectric material portions directly contact a subset of the initial first drain select level electrically conductive layers but not the initial second drain select level electrically conductive layers, or a subset of the initial second drain level electrically conductive layers but not the initial first drain select level electrically conductive layers;

levels of the initial first drain select level electrically conductive layers are interlaced with levels of the initial second drain select level electrically conductive layers;

the initial first drain select level electrically conductive layers are arranged as first multiple strips that are laterally spaced apart within each level in the first set of multiple levels; and the initial second drain select level electrically conductive layers are arranged as second multiple strips that are laterally spaced apart within each level in the second set of multiple levels.

2. The three dimensional memory device of claim 1, wherein each of the initial first and second drain select level electrically conductive layers has a pair of tapered sidewalls that extend along a first horizontal direction.

3. The three-dimensional memory device of claim 2, wherein:
each of the initial first drain select level electrically conductive layers has a top surface that is wider than a bottom surface thereof; and
each of the initial second drain select level electrically conductive layers has a top surface that is narrower than a bottom surface thereof.

4. The three-dimensional memory device of claim 2, wherein:
each of the initial first drain select level electrically conductive layers has an inverse trapezoidal vertical cross-sectional shape within a vertical plane perpendicular to the first horizontal direction; and
each of the initial second drain select level electrically conductive layers has a trapezoidal vertical cross-sectional shape within the vertical plane perpendicular to the first horizontal direction.

5. A three-dimensional memory device comprising:
an alternating stack of insulating layers and stack level electrically conductive layers located over a top surface of a substrate;
initial first drain select level electrically conductive layers and initial second drain select level electrically conductive layers that are vertically offset and located over the alternating stack, wherein the initial second drain select level electrically conductive layers are vertically offset from the initial first drain select level electrically conductive layers and are located in areas that do not overlap with the initial first drain select level electrically conductive layers in a plan view along a direction perpendicular to the top surface of the substrate;
a first set of memory stack structures extending through the alternating stack and the initial first drain select level electrically conductive layers; and
a second set of memory stack structure extending through the alternating stack and the initial second set of electrically conductive layers;

wherein:
each memory stack structure of the first and the second sets of memory stack structure comprises a vertical channel and a memory film;
the stack level electrically conductive layers comprise horizontal word lines, wherein each word line contacts the first and the second set of memory stack structures and does not have vertically offset portions;
the first set of memory stack structures directly contacts the initial first drain select level electrically conductive layers and does not directly contact the second drain select level electrically conductive layers; and
the second set of memory stack structure directly contacts the initial second drain select level electrically conductive layers and does not directly contact the first drain select level electrically conductive layers.

6. A three-dimensional memory device comprising:
an alternating stack of insulating layers and stack level electrically conductive layers located over a top surface of a substrate;
initial first drain select level electrically conductive layers and initial second drain select level electrically conductive layers that are vertically offset and located over the alternating stack, wherein the initial second drain select level electrically conductive layers are vertically offset from the initial first drain select level electrically conductive layers and are located in areas that do not overlap with the initial first drain select level electrically conductive layers in a plan view along a direction perpendicular to the top surface of the substrate;
a first set of memory stack structures extending through the alternating stack and the initial first drain select level electrically conductive layers;
a second set of memory stack structure extending through the alternating stack and the initial second set of electrically conductive layers;
additional first drain select level electrically conductive layers and additional second drain select level electrically conductive layers located vertically above the initial first drain select level electrically conductive layers and the initial second drain select level electrically conductive layers; and
insulating spacer layers located between each vertically neighboring pair of initial and additional first drain select level electrically conductive layers and between each vertically neighboring pair of initial and additional second drain select level electrically conductive layers, wherein each bottommost initial second drain select level electrically conductive layer is located above a first horizontal plane including top surfaces of bottommost initial first drain select level electrically conductive layers and below a topmost surface of an insulating spacer layer that contacts the initial bottommost first drain select level electrically conductive layers.

7. The three-dimensional memory device of claim 6, wherein:
a bottommost insulating spacer layer among the insulating spacer layers has a planar bottom surface that contacts a planar top surface of a topmost insulating layer of the alternating stack of insulating layers and stack level electrically conductive layers;
vertically protruding portions of the bottommost insulating spacer among the insulating spacer layers contact a respective one of the second drain select level electrically conductive layers; and
recessed portions of the bottommost insulating spacer among the insulating spacer layers contact a respective one of the first drain select level electrically conductive layers.

8. A three-dimensional memory device comprising:
an alternating stack of insulating layers and stack level electrically conductive layers located over a top surface of a substrate;
initial first drain select level electrically conductive layers and initial second drain select level electrically conductive layers that are vertically offset and located over the alternating stack, wherein the initial second drain select level electrically conductive layers are vertically offset from the initial first drain select level electrically conductive layers and are located in areas that do not overlap with the initial first drain select level electrically conductive layers in a plan view along a direction perpendicular to the top surface of the substrate;
a first set of memory stack structures extending through the alternating stack and the initial first drain select level electrically conductive layers; and
a second set of memory stack structure extending through the alternating stack and the initial second set of electrically conductive layers;

wherein:
the three-dimensional memory device comprises a monolithic three-dimensional NAND memory device;
some of the stack level electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the stack level electrically conductive layers comprise a plurality of control gate electrodes having a strip shape extending substantially parallel to the top surface of the substrate, and the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

\* \* \* \* \*